US011538511B2

(12) United States Patent
Shalmani et al.

(10) Patent No.: US 11,538,511 B2
(45) Date of Patent: Dec. 27, 2022

(54) APPARATUS AND METHODS FOR FRACTIONAL SYNCHRONIZATION USING DIRECT DIGITAL FREQUENCY SYNTHESIS

(71) Applicant: Ciena Corporation, Hanover, MD (US)

(72) Inventors: Soheyl Ziabakhsh Shalmani, Kanata (CA); Robert Gibbins, Stittsville (CA); Sadok Aouini, Gatineau (CA); Mohammad Honarparvar, Gatineau (CA); Naim Ben-Hamida, Nepean (CA); Youssef Karmous, Stittsville (CA); Christopher Kurowski, Nepean (CA)

(73) Assignee: Ciena Corporation, Hanover, MD (US)

( * ) Notice: Subject to any disclaimer, the term of this patent is extended or adjusted under 35 U.S.C. 154(b) by 168 days.

(21) Appl. No.: 17/173,737

(22) Filed: Feb. 11, 2021

(65) Prior Publication Data
US 2022/0254394 A1    Aug. 11, 2022

(51) Int. Cl.
*G11C 7/22* (2006.01)
*G11C 7/10* (2006.01)
*H03L 7/199* (2006.01)
*H03M 1/10* (2006.01)
*H03L 7/081* (2006.01)
*H03K 5/156* (2006.01)
(Continued)

(52) U.S. Cl.
CPC ............ *G11C 7/222* (2013.01); *G11C 7/1015* (2013.01); *H03K 5/1565* (2013.01); *H03L 7/0816* (2013.01); *H03L 7/091* (2013.01); *H03L 7/199* (2013.01); *H03M 1/1019* (2013.01); *H03M 1/785* (2013.01)

(58) Field of Classification Search
None
See application file for complete search history.

(56) References Cited

U.S. PATENT DOCUMENTS

2010/0166123 A1* 7/2010 Pellon .................... H03B 28/00
375/344

OTHER PUBLICATIONS

Y. Yang, X. Shi, F. Su, Z. Wang, P. Yang, H. Yang, Y. Liu, "A 2.2-GHz Configurable Direct Digital Frequency Synthesizer Based on LUT and Rotation," IEEE Transactions on Circuits and Systems I: Regular Papers, vol. 66, No. 5, May 2019.
(Continued)

*Primary Examiner* — Cassandra F Cox
(74) *Attorney, Agent, or Firm* — Young Basile Hanlon & MacFarlane, P.C.

(57) ABSTRACT

Described are apparatus and methods for fractional synchronization using direct digital frequency synthesis (DDFS). A DDFS device includes a memory with N address spaces, a write port circuit configured to sequentially write a digital desired pattern into the N address spaces, a read port circuit configured to readout the digital desired pattern from the N address spaces using continuous sequential automatic addressing from 0 to N−1 at a memory operating frequency clock, where the memory operating frequency clock is based on a sampling frequency clock used for high-speed data processing, and an analog signal processing circuit configured to process a readout digital desired pattern into an analog representation; and output a synthesized frequency clock from the analog representation to a digital core, where the synthesized frequency clock is fractionally synchronized with the sampling frequency clock.

23 Claims, 17 Drawing Sheets

(51) Int. Cl.
*H03M 1/78* (2006.01)
*H03L 7/091* (2006.01)

(56) References Cited

OTHER PUBLICATIONS

S. E. Turner, J. D. Cali, "Phase Coherent Frequency Hopping in Direct Digital Synthesizers and Phase Locked Loops," IEEE Transactions on Circuits and Systems I: Regular Papers, vol. 67, No. 6, Jun. 2020.
J. Choi et al., "Design and Analysis of Low Power and High SFDR Direct Digital Frequency Synthesizer," IEEE Access, vol. 8, pp. 67581-67590, 2020, doi: 10.1109/ACCESS.2020.2986016.
F. Yoo, Y. Jung, H. C. Yeoh, Y. S. Kim, S. Kang, and K. Baek, "A 2GHz 130mW direct-digital frequency synthesizer with a non-linear DAC in 55nm CMOS," IEEE J. Solid-State Circuits, vol. 49, No. 12, p. 2976_2989, Feb. 2014.

* cited by examiner

APPARATUS AND METHODS FOR FRACTIONAL SYNCHRONIZATION USING DIRECT DIGITAL FREQUENCY SYNTHESIS

TECHNICAL FIELD

This disclosure relates to frequency synthesis. More specifically, this disclosure relates to fractional synchronization between a sampling clock and a digital core clock using direct digital frequency synthesis (DDFS).

BACKGROUND

DDFS techniques are used for generating signal waveforms based on a reference signal and digitally stored waveform patterns. The generation of accurate and synchronized signal waveforms are used in applications, such as electronic measurement equipment, wireless communication transceivers, defense system, medical devices, and instrumentation. DDFS seems to alleviate many of the issues facing high-speed clock generation. In addition, DDFS provides the opportunity to employ highly efficient digital circuits to generate low-jitter high-speed signal waveforms. Consequently, it is expected DDFS will achieve high-performance (i.e., fast frequency switching, high frequency resolution, wide frequency bandwidth, and low spectral spurs) in advanced technology nodes. Despite evident benefits, DDFS has some critical deficiencies including, but not limited to, high power usage and use of a large read-only-memory (ROM) size to achieve high resolution in frequency.

Conventional approaches to realize a DDFS are based on a phase accumulator (PA) and a look-up table (LUT). In these conventional designs of the DDFS, the input stages are designed based on phase accumulating and mapping into a sine wave using the LUT. The size of the LUT limits these designs if very high resolution or fine resolution is required, where resolution is clock frequency/$2^N$, N being the number of bits in the input frequency control word (FCW). That is, the PA and LUT consume more chip area as the resolution is increased. This limits design specifications in terms of speed and power consumption. Another limitation of previous designs is having an offset with a fixed duty cycle at the output. In order to have more flexibility in these designs, a complicated digital circuit is needed which uses an external controller. This increases the complexity of the design and chip area. In addition, typical implementations cannot achieve sub-part-per-million (sub-ppm) accuracy as this would require a huge memory for the LUT as the size of the LUT is proportional to the addressing range, which is related to the FCW. Moreover, the output is a function of input frequency control work (FCW) and LUT, which can impact the output jitter.

Various existing DDFS designs attempt to resolve the power and memory size issues. For example, one design uses a pipeline PA with multi-level momentarily activated bias (M2AB) using complementary metal-oxide-semiconductor (CMOS) based logic to decrease the power consumption. However, the offset error at the output and low spurious free dynamic range (SFDR) limits performance. Another design uses a configurable DDFS based on LUT-rotation architecture to reduce the latency and complexity of digital implementations. A drawback of this design is that there is a trade-off between distortion, LUT size, and rotation. Accordingly, to maximize the SFDR four modes of dynamic-active rotation with a complicated digital processor are required. Another design addresses the dominant spur caused by truncation errors to improve the performance. By doing so, an enhanced dithering technique utilizing a fully CMOS digital implementation is presented. This design confines the circuit designer to work with low-threshold voltage (LUT) transistors and implementing the high-speed flip-flops with true single-phase clock (TSPC) techniques. In another design, the LUT was eliminated from prior frequency/fractional control words and an accumulator with a fixed incremental step was used. The output of the accumulator is then multiplied to generate the desired output frequency and phase. This comes at the expense of using an accurate multiplier where its complexity is increased by the input FCW. These limitations impact the use of DDFS in portable devices, for example.

SUMMARY

Described herein are apparatus and methods for fractional synchronization using direct digital frequency synthesis (DDFS).

In implementations, a direct digital frequency synthesizer includes a memory with N address spaces, a write port circuit configured to sequentially write a digital desired pattern into the N address spaces, a read port circuit configured to readout the digital desired pattern from the N address spaces using continuous sequential automatic addressing from 0 to N−1 at a memory operating frequency clock, where the memory operating frequency clock is based on a sampling frequency clock used for high-speed data processing, and an analog signal processing circuit configured to process a readout digital desired pattern into an analog representation, and output a synthesized frequency clock from the analog representation to a digital core, where the synthesized frequency clock is fractionally synchronized with the sampling frequency clock.

In implementations, the direct digital frequency synthesizer further includes a divider configured to divide down the sampling frequency clock to generate the memory operating frequency clock. In implementations, the direct digital frequency synthesizer further includes a phase rotator configured to rotate a phase of a divided down sampling frequency clock to generate the memory operating frequency clock. In implementations, the analog signal processing circuit further includes a tunable common-mode correction circuit configured to adjust a duty cycle of the synthesized frequency clock. In implementations, the analog signal processing circuit further includes a common-mode correction circuit, a resistor ladder connected to a common-mode voltage input of the common-mode correction circuit, and a voltage tuner connected to resistor ladder, the voltage tuner configured to control a configuration of the resistor ladder which adjusts the common-mode voltage input to set a duty cycle of the synthesized frequency clock. In implementations, the write port circuit and the read port circuit use a single port. In implementations, a port used for writing the digital desired pattern into the memory is shut down after N write cycles. In implementations, the read port circuit further includes a test circuit configured to sample the synthesized frequency clock at a memory operating frequency clock/N rate. In implementations, the analog signal processing circuit further includes each digital desired pattern has a defined number of periods M. In implementations, a frequency of the synthesized frequency clock is determined from the N address spaces, the defined number of periods M, and the sampling frequency clock. In implementations, the direct digital frequency synthesizer further includes another memory with N' address spaces, another write port circuit configured to sequentially write another digital desired pattern into the N' address spaces, another read port circuit configured to readout the another digital desired pattern from the N' address spaces using continuous sequential automatic addressing from 0 to N'−1 at the synthesized frequency clock received from the analog signal processing circuit, and another analog signal processing circuit configured to process a readout another digital desired pattern into another analog representation and output another synthesized frequency clock from the another analog representation to the digital core.

In implementations, a method for direct digital frequency synthesis includes sequentially writing a digital desired pattern into a memory with N addresses, continually sequentially reading the digital desired pattern using a memory operating frequency clock, the memory operating frequency clock based on a sampling frequency clock which is used for high-speed data processing, processing a readout digital desired pattern into an analog representation with a desired duty cycle, and outputting a synthesized frequency clock from the analog representation to a digital core, where the synthesized frequency clock is fractionally synchronized with the sampling frequency clock.

In implementations, the method further includes dividing down the sampling frequency clock to generate the memory operating frequency clock. In implementations, the method further includes phase rotating a divided down sampling frequency clock to generate the memory operating frequency clock. In implementations, the method further includes adjusting a duty cycle of the synthesized frequency clock by controlling a common-mode voltage. In implementations, the method further includes controlling a common-mode voltage by switching on/off resistors in a resistor ladder to change a duty cycle of the synthesized frequency clock. In implementations, the sequentially writing and continually sequentially reading use a single port. In implementations, the method further includes the single port for sequentially writing after N write cycles. In implementations, each digital desired pattern has a defined number of periods M and wherein a frequency of the synthesized frequency clock is determined from the N address spaces, the defined number of periods M, and the sampling frequency clock.

In implementations, a device including a memory with N addresses, a port configured to sequentially write a digital desired pattern with M periods into the N addresses, the port configured to continually readout in sequence the digital desired pattern from the N addresses at a memory operating frequency clock, wherein the memory operating frequency clock is divided down from a clock used for high-speed data processing, and an analog signal processing circuit configured to output an analog synthesized frequency clock with a defined duty cycle from the readout digital desired pattern to a digital core, where the analog synthesized frequency clock is fractionally synchronized with the clock and a rate of the analog synthesized frequency clock is determined from the N addresses, the M periods, and the clock.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1:
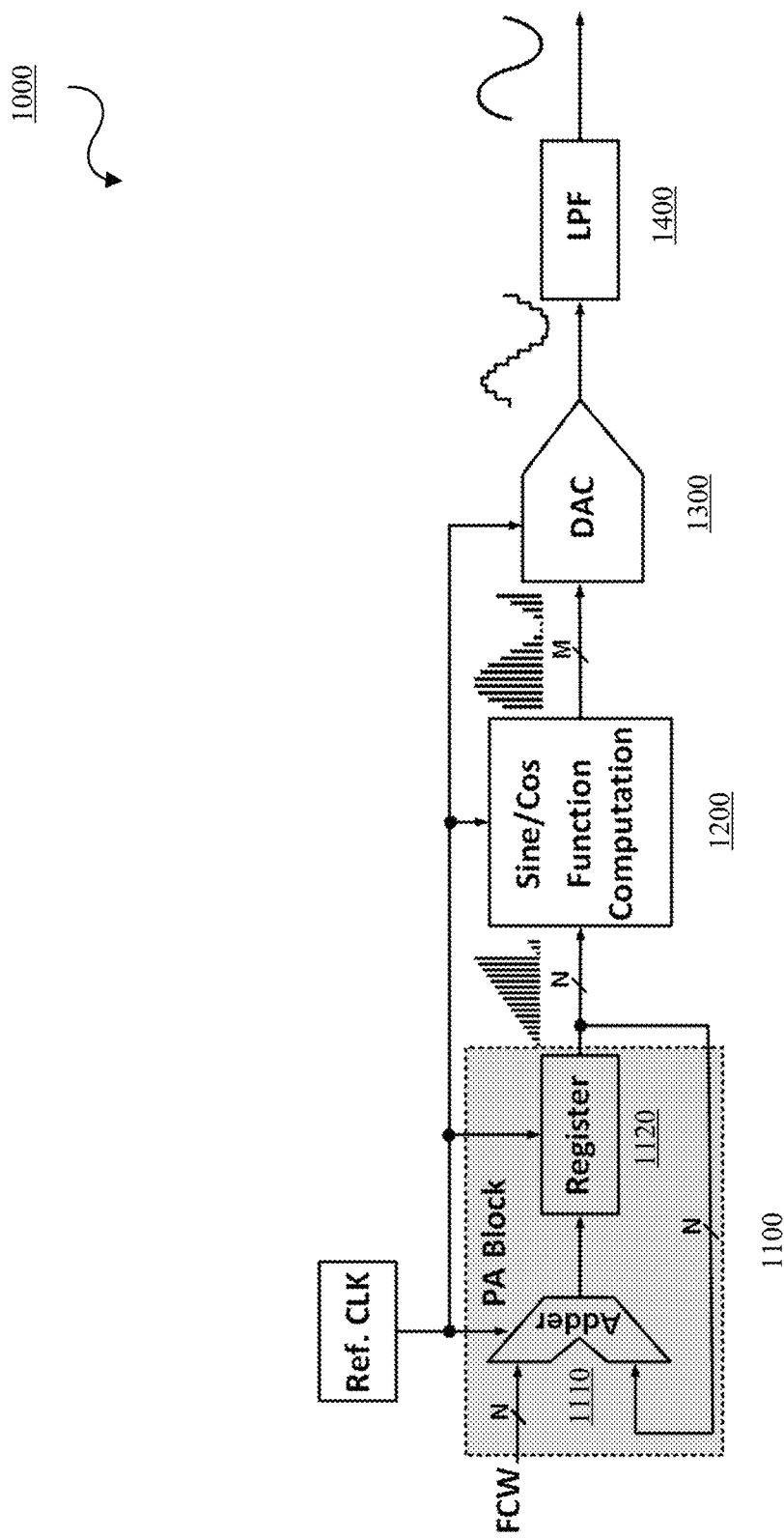
FIG. 1 is a block diagram of a direct digital frequency synthesis (DDFS) circuit.

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "computer" or "computing device" includes any unit, or combination of units, capable of performing any method, or any portion or portions thereof, disclosed herein. The computer or computing device may include a processor.

As used herein, the terminology "processor" indicates one or more processors, such as one or more special purpose processors, one or more digital signal processors, one or more microprocessors, one or more controllers, one or more microcontrollers, one or more application processors, one or more central processing units (CPU)s, one or more graphics processing units (GPU)s, one or more digital signal processors (DSP)s, one or more application specific integrated circuits (ASIC)s, one or more application specific standard products, one or more field programmable gate arrays, any other type or combination of integrated circuits, one or more state machines, or any combination thereof.

As used herein, the terminology "memory" indicates any computer-usable or computer-readable medium or device that can tangibly contain, store, communicate, or transport any signal or information that may be used by or in connection with any processor. For example, a memory may be one or more read-only memories (ROM), one or more random access memories (RAM), one or more registers, low power double data rate (LPDDR) memories, one or more cache memories, one or more semiconductor memory devices, one or more magnetic media, one or more optical media, one or more magneto-optical media, or any combination thereof.

As used herein, the terminology "instructions" may include directions or expressions for performing any method, or any portion or portions thereof, disclosed herein, and may be realized in hardware, software, or any combination thereof. For example, instructions may be implemented as information, such as a computer program, stored in memory that may be executed by a processor to perform any of the respective methods, algorithms, aspects, or combinations thereof, as described herein. Instructions, or a portion thereof, may be implemented as a special purpose processor, or circuitry, that may include specialized hardware for carrying out any of the methods, algorithms, aspects, or combinations thereof, as described herein. In some implementations, portions of the instructions may be distributed across multiple processors on a single device, on multiple devices, which may communicate directly or across a network such as a local area network, a wide area network, the Internet, or a combination thereof.

As used herein, the term "application" refers generally to a unit of executable software that implements or performs one or more functions, tasks or activities. The unit of executable software generally runs in a predetermined environment and/or a processor.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, compositions and methods. Those of ordinary skill may thus recognize that other elements and/or steps may be desirable or necessary to implement the devices, systems, compositions and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

FIG. 1 is a block diagram of a direct digital frequency synthesis (DDFS) circuit 1000. The DDFS circuit 1000 includes a phase accumulator (PA) 1100, a look-up table (LUT) 1200, a digital-to-analog converter (DAC) 1300, and a low pass filter (LPF) 1400. The PA 1100 includes a N-bit adder 1110 and a register 1120. The N-bit adder 1110 and the register 1120 generate ramp shape phase information by accumulating the input frequency control word (FCW). The LUT 1200 converts the ramp shape phase information to a sine and/or cosine function. The LUT 1200 maps the input phase to a corresponding sine and/or cosine amplitude, where the address to the ROM (i.e., the LUT 1200) is the input phase word and the output from the ROM is the amplitude word. The DAC 1300 and the LPF 1400 form and/or reconstruct an analog signal from the output signal from the ROM, where most of the high-frequency harmonics are filtered out by the LPF 1400. In addition to other described issues, a large ROM (LUT) is required to achieve high frequency resolution. In this instance, large refers to the size of the ROM lookup table. A large ROM size is needed for high resolution. Here, high refers to fine resolution. In order to achieve very small frequency step (fine resolution), a large ROM lookup table is required. Consequently, to reduce the ROM size, the most significant bits of the phase accumulator (PA) are used which produces some quantization error. This advances a chip implementation but at the cost of some quantization errors.

Described herein are apparatus, devices, circuits, systems, and methods for fractional synchronization using direct digital frequency synthesis (DDFS). In implementations, the DDFS in a fractional synthesizer uses a customized digital standard cell-based digital data storage (DDS) memory to receive coherent phase and frequency and achieve fine tuning of the frequency at the output. The described DDFS does not require a PA and a LUT. The output signal is a pulse shape clock having an adjustable duty cycle.

In implementations, a highly digital DDFS is implemented for frequency synthesizers which exploits the benefits of synchronization of a digital core clock with a sampling clock produced by a digital phase-locked loop (PLL) with a root means square (rms) jitter of less than 3 picoseconds (ps) rms. The DDFS operates over a wide range of sampling clocks, while taking advantage of the technology scaling due to low power requirements and a small silicon footprint. True frequency scaling is achieved in contrast to clock gating or gapping for example. The digital core takes advantage of supply and/or power scaling as timing margins are more relaxed for lower clock rates. That is, the DDFS architecture supports supply voltage and/or power scaling for the digital core as the frequency is scaled. This is attractive when supporting multiple baud rates and allows for significant digital power scaling as a function of the baud rate. In contrast, traditional simple clock gapping (or gating) does not support supply scaling.

In implementations, multiple DDFS architectures are described which synchronize the sampling clock with a digital core clock without using any accumulator and LUT. The memory used in the DDFS architectures is able to store any input pattern and present a coherent clock. For example, the memory includes WRITE and READ port architectures to capture an input pattern and output a digital word. The output of the memory connects to a DAC, a common-mode correction (CMC) circuit, and a comparator with the ability to change the duty cycle from 1% to 99%. The DDFS architectures are highly digital and implementable in advanced technology nodes. The DDFS architectures synchronize the sampling clock and the digital core clock in a PLL-type fashion at very high-speed (where very high-speed is relative to the PLL clock and $f_{MEMORY}$ as described herein) with low power (e.g., less than 3 mW). However, these implementations do not require a voltage-controlled oscillator (VCO), a PLL, and/or an on-chip complicated calibration circuit.

In implementations, a DDFS architecture includes a phase rotator at the high-speed clock path input to receive different fractional frequencies with high resolution. The phase rotator is controlled via the digital core or a controller. The phase rotator enables sub-ppm resolution which is not achievable in conventional designs. That is, the phase rotator enables fine tuning of frequency and/or phase and produces different offsets at the output phase without increasing the complexity of the DDFS circuit.

In implementations, a DDFS architecture cascades together two DDFS blocks in order to achieve less than a 0.25 MHz frequency resolution. An output of a first DDFS block is an input to a second DDFS block. In implementations, one or more of the two DDFS blocks can be a DDFS block which includes a phase rotator.

In implementations, the memory or storage architecture described herein can read speeds higher than achievable in off-the-shelf embedded memory offerings due to circuitry which cycles through all column addresses (m) at a rate m times faster than the row column addressing rate addressing, the read port output bits are pitch-matched to a follow-on DAC's input bits, a small write port is used to minimize the number of macro pins needed to support the write function, and uses a single supply versus dual supply voltages for off-the-shelf offerings, with incur attendant max delta voltage restrictions between the two supply levels.

In implementations, the DDFS architectures are largely implemented by digital circuits. Consequently, the chip area is very small and power consumption is mostly dynamic power and not static power.

Figure 2:
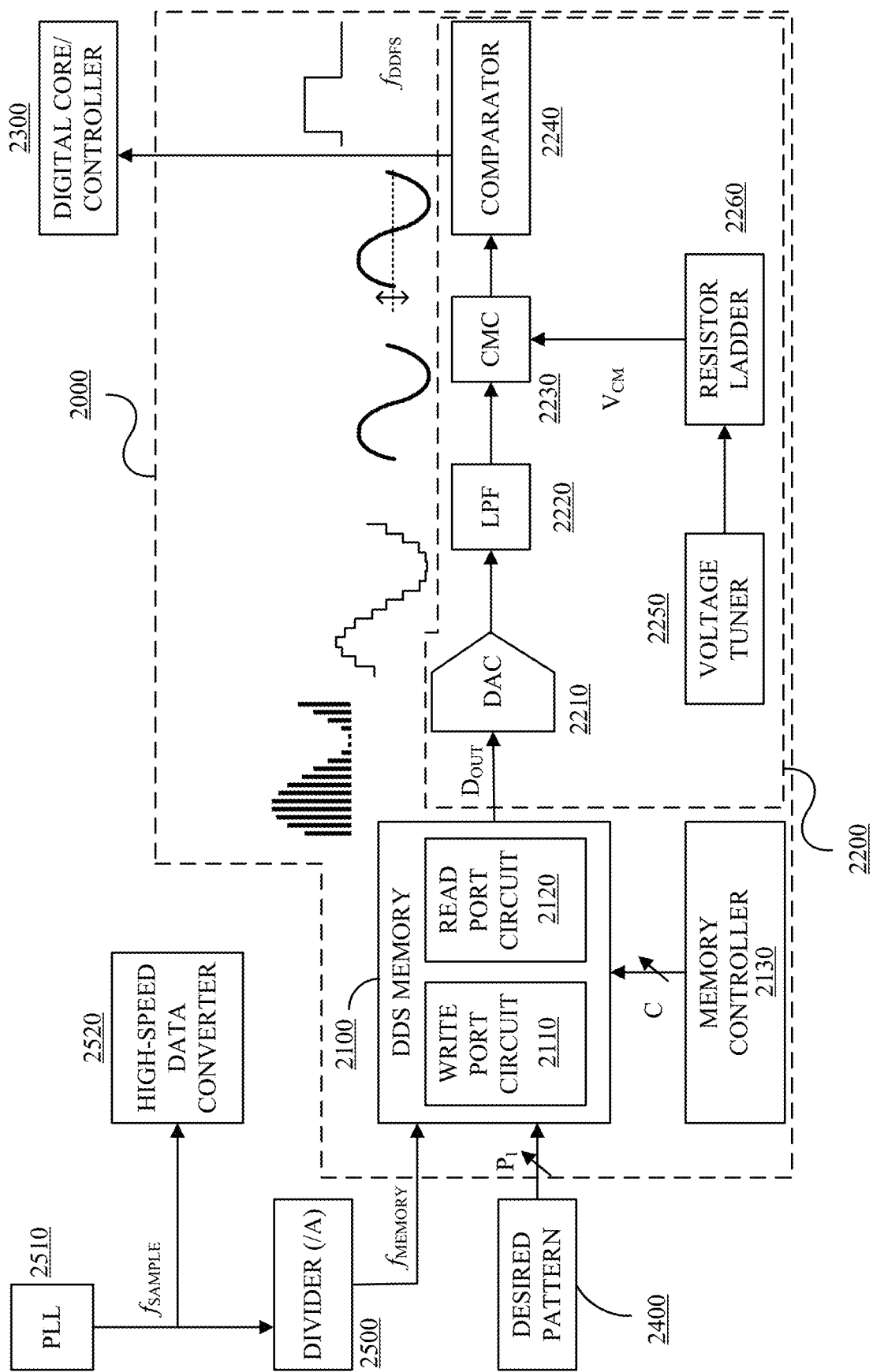
FIG. 2 is a block diagram of a DDFS in accordance with embodiments of this disclosure.

FIG. 2 is a block diagram of a DDFS architecture and/or circuit 2000 in accordance with embodiments of this disclosure. In implementations, the DDFS circuit 2000 includes a DDS memory block or circuit 2100 which stores an arbitrary sequence of frequency hops and generates appropriate outputs ($D_{OUT}$). The DDS memory block or circuit 2100 is connected to or in communication with (collectively "connected to") an analog signal processing or backend circuit 2200 which outputs a DDFS frequency ($f_{DDFS}$) to a digital core, controller, and the like (collectively "digital core") 2300. In implementations, the DDS memory circuit 2100 includes an input ($P_I$) connected to a register 2400, where the register 2400 includes one or more digital patterns, templates, or representations of a desired waveform (collectively "desired pattern") such as a sine, cosine, triangle, or other waveform. In implementations, the DDS memory circuit 2100 includes a write port architecture or circuit 2110 and a read port architecture or circuit 2120.

In implementations, the write port architecture or circuit 2110 is a low-speed write port. That is, the operational speed of the write port does not have to be high-speed. In fact, for a given memory pattern, the write port is a write once operation so the speed is unimportant. In implementations, a conventional write port architecture is sufficient. In implementations, the write port can run at rck/8 (8× slower than the read port. In practice, the digital core can write the memory with simple register updates, which can take approximately 500 ns per address. That is, the time taken to fill the memory is dictated by the approach adopted in the digital core, not the memory design itself.

In implementations, the read port architecture or circuit 2120 is a high-speed read port. In this instance, high-speed is faster than what can be achieved with traditional random access memory architectures, which pick one row, and per output data bit one column, per memory access. In implementations, high-speed is at least approximately 2.5 GHz or better. The DDS memory circuit 2100 is controlled by a memory controller 2130. The read port architecture or circuit 2120 operates at a frequency or rate (($f_{MEMORY}$), where the $f_{MEMORY}$ clock is generated from a sampling frequency clock ($f_{SAMPLE}$) divided down by a divider 2500. The $f_{SAMPLE}$ clock is provided by a phase-locked loop (PLL) 2510, where the $f_{SAMPLE}$ clock is used by a high-speed data converter 2520, for example. However, the divider 2500 is needed as the digital core operates at frequencies lower than the $f_{SAMPLE}$ clock.

As stated, the read port architecture or circuit 2120 operates at $f_{MEMORY}$. The equation for the synthesized frequency clock ($f_{DDS}$) is then $f_{DDS}=f_{MEMORY} \times M/N$, where N is the memory address depth and M the number of periods encoded in the memory. For example, if $f_{MEMORY}=3.125$ GHz, N=576, and M=96, then $f_{DDS}=520.83$ MHz. The number of periods or number of copies of the desired pattern in memory, M, can be reprogrammed in order to achieve different frequency hopping. The number of N and M can be readily changed based on design specifications. Since fine frequency resolution can be achieved by setting N and M parameters, the coherency on phase, synchronization of the $f_{DDFS}$ with the $f_{SAMPLE}$, and low offset frequency are inherently achieved. For example, assume $f_{MEMORY}=f_{SAMPLE}/24$, N=576, M=96, and $f_{SAMPLE}=75$ Gs/s. Then $f_{DDS}=f_{SAMPLE}/24*96/576=f_{SAMPLE}/144 \sim 520.83$MHz. Now, set M=95 (change the pattern in the memory), then $f_{DDS} \sim 515.41$MHz. This results in about a 5 MHz frequency resolution.

In implementations, the analog signal processing circuit 2200 includes a DAC 2210 connected to an LPF 2220, which in turn is connected to a CMC 2230. In implementations, the DAC 2210 is a Nyquist rate DAC. In implementations, the DAC 2210 is a R-2R resistor ladder DAC. The CMC 2230 is connected to a comparator 2240, which in turn outputs an analog representation ($f_{DDFS}$) to a digital core, controller, and the like (collectively "digital core") 2500. In implementations, the comparator 2240 is a low-offset comparator. A voltage tuner 2250 is connected to a resistor ladder 2260, which in turn is connected to the CMC 2230. The voltage tuner 2250 and the resistor ladder 2260 are used to adjust the common-mode voltage and/or duty cycle of the output clock ($f_{DDS}$).

Operationally, a desired pattern from the register 2400 is written into the DDS memory 2100 via the write port circuit 2110. Digital words or codes representing the desired pattern are read out to the analog signal processing or backend circuit 2200 via the read port circuit 2120 at the operating rate of $f_{MEMORY}$ ($D_{OUT}$). The DAC 2210 converts the digital words to an analog representation. The output of DAC 2210 is filtered or processed by the LPF 2220 to pass the desired spectrum and remove spurs such that the output is a clean signal with variable offset. The CMC 2230 processes the output of the LPF 2220 for common-mode voltage and set a duty cycle for the output clock. The common-mode voltage and/or duty cycle can be adjusted using the voltage tuner 2250 and the resistor ladder 2260. The output of the CMC 2230 is then processed by the comparator 2240 to provide the output digital clock ($f_{DDFS}$).

In an example, $f_{MEMORY}$ is 3.125 GHz and the DAC 2210 is a Nyquist rate 6 bit DAC. In this instance, the DDFS achieves a 2.03 psec RMS jitter over a 300 MHz signal bandwidth with the update rate set at $f_{MEMORY}$ of 3.125 GHz while consuming less than 3 mW in a FinFet 7 nm technology. The form factor occupies a core area of 0.014 mm², which is relatively small compared to the size of the overall board or chip (e.g., a magnitude of at least 10 times smaller).

Figure 3:
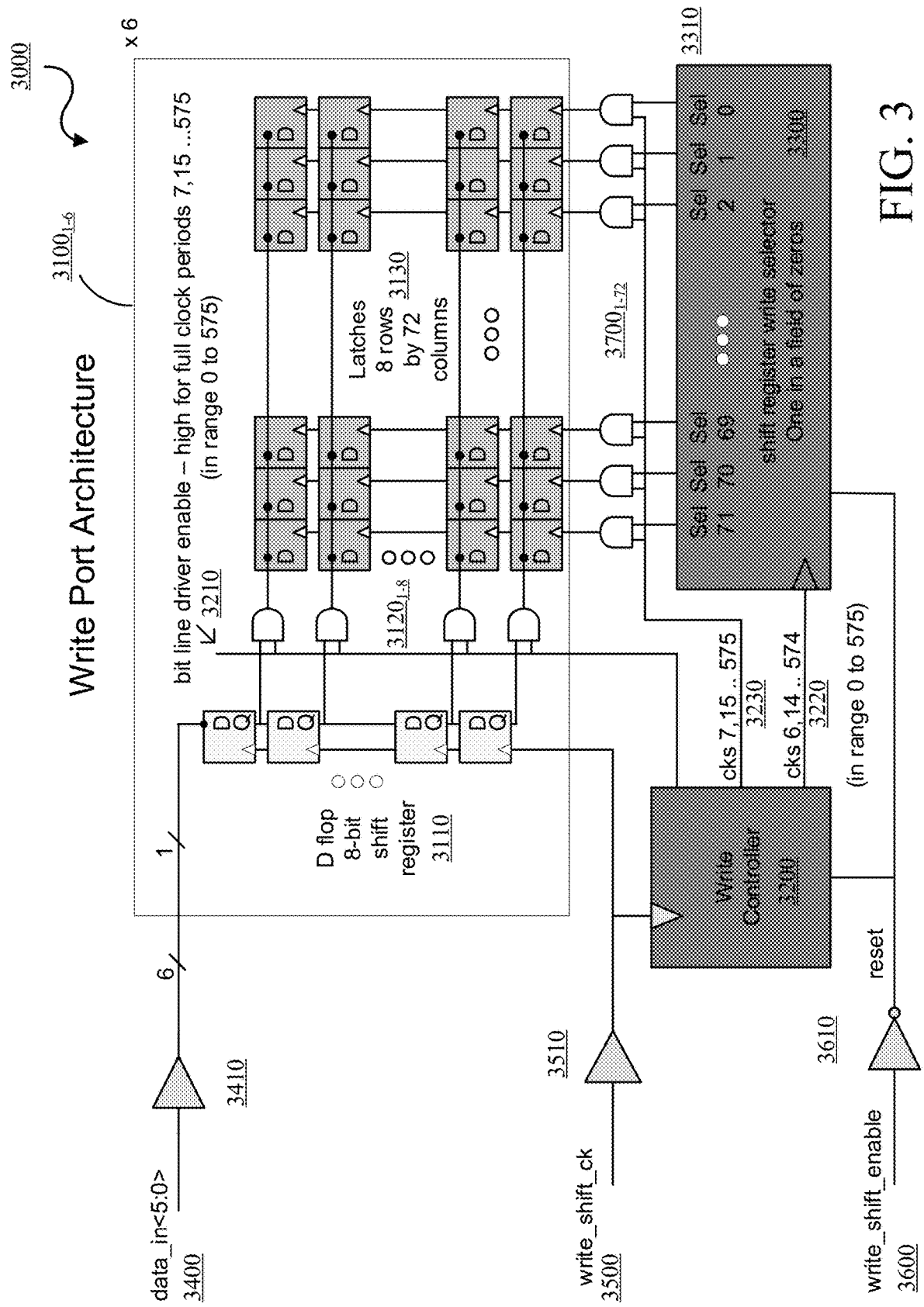
FIG. 3 is a block diagram of an example of a write port architecture in accordance with embodiments of this disclosure.
Figure 4:
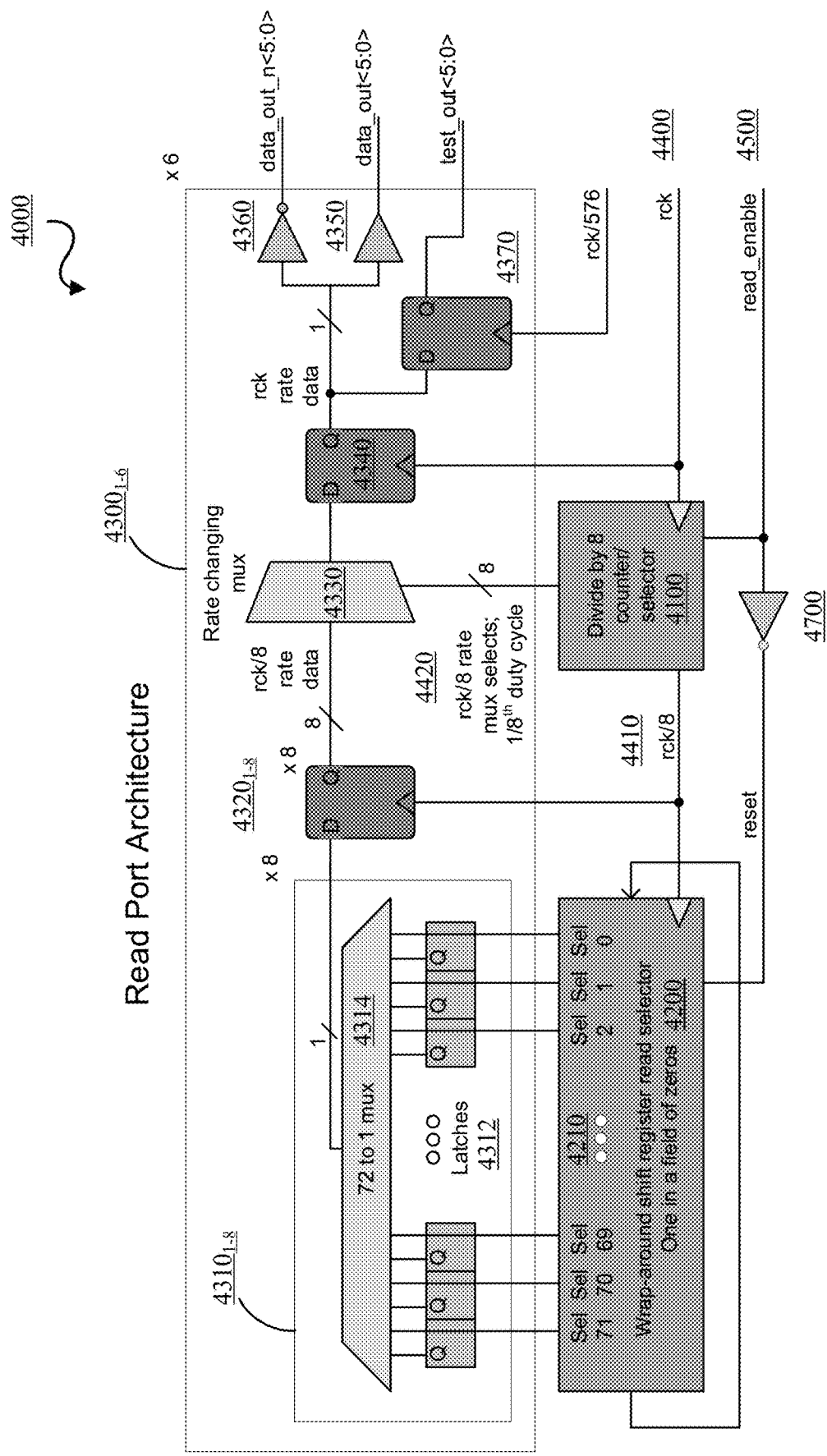
FIG. 4 is a block diagram of an example of a read port architecture in accordance with embodiments of this disclosure.

The DDS memory circuit 2100 is shown in greater detail in FIG. 3, which shows a write port architecture or circuit 3000, and in FIG. 4, which shows a read port architecture or circuit 4000. The DDS memory circuit 2100, the write port architecture or circuit 3000, and the read port architecture or circuit 4000 are shown when the $f_{MEMORY}$ is set to 3.125 GHz. The DDS memory circuit 2100, the write port architecture or circuit 3000, and the read port architecture or circuit 4000 can be adjusted for other $f_{MEMORY}$ frequencies without departing from the scope of the specification or claims. In this instance, a storage or memory of the DDS memory circuit 2100 has a storage capacity of 3456 bits configured as 576 addresses. In implementations, the storage is realized using standard cells. In implementations, the storage is realized as a 48 row by 72 column array of latches.

FIG. 3 is a block diagram of an example of the write port architecture or circuit 3000 in accordance with embodiments of this disclosure. The write port architecture or circuit 3000 is configured as 576 6-bit words to keep a small port width with respect to the register 2400 in FIG. 1. The write port architecture or circuit 3000 includes write port input blocks 3100$_{1-6}$, each write port input block is connected to a write controller 3200 and a shift register 3300. Each of the write port input blocks 3100$_{1-6}$ includes an 8 bit series-to-parallel shift register 3110, 8 logical AND gates 3120$_{1-8}$, and 576 latches configured as an 8 row by 72 column array, referred to as storage portion or slice 3130. In implementations, the 8 bit series-to-parallel shift register 3110 includes 8 D flip-flops. In implementations, the shift register 3300 is a 72 bit shift register. Each output of the 8 bit series-to-parallel shift register 3110 is connected to an input of a logical AND gate 3120. A remaining input of the 8 bit series-to-parallel shift register 3110 is connected to a bit line driver enable 3210 from the write controller 3200. The write controller 3200 sends clocks 6, 14, . . . , 574 3220 to a clock input of the shift register 3300 and sends clocks 7, 15, . . . , 575 3230 to an input of logical AND gates 3700$_{1-72}$. A remaining input of the logical AND gates 3700$_{1-72}$ is connected to a selection output 3310 from the shift register 3300.

The write port architecture or circuit 3000 includes three inputs, a data_in word 3400, a write clock 3500, and a write enable 3600. In implementations, the data_in word 3400 is a 6 bit input word. For example, the data_in word 3400 is connected to register 2400 in FIG. 1. One input bit of the data_in word 3400 is connected, via a delay 3410, to the 8 bit series-to-parallel shift register 3110 in one of the write port input blocks 3100$_{1-6}$. That is, the write port input block is a per input bit configuration. The write clock 3500 is connected, via a delay 3510, to the write controller 3200 and the 8 bit series-to-parallel shift register 3110. The write enable 3600 is connected, via an inverter 3610, to the write controller 3200 and the shift register 3300. The write clock 3500, the write enable 3600, and the write data come from the digital core 2300, for example. In this instance, the write enable 3600 and the first six bit data word would be set up, then the clock register would be taken high, then low, then the next data word would be applied, etc. Consequently, 3 register writes per write address are needed: 1) write the data register, 2) write the clock register to a one, and 3) write the clock register to a zero.

As noted, the write port architecture or circuit 3000 is a low-speed port. The write port architecture or circuit 3000 uses one-pass sequential automatic addressing from 0 to 575 and therefore requires no write address bus. The write port architecture or circuit 3000 fills the storage with the desired pattern in 576 write cycles and then the write port is shut down.

Operationally, every eight write clock cycles, the six 1-in to 8-out series-to-parallel shift registers 3110 convert the incoming 6-bit data word 3400 to a 48-bit data word. To avoid unnecessary bit line transitions during the series-to-parallel shift operations, the bit line drivers 3210 are only enabled for the period of the last clock of every eight sequential clocks. This every-eighth clock also raises a selected word line driver for the first half of the clock period, thereby ensuring that the bit line data is held for a half clock cycle after the selected column of latches is closed. The address of the word line driver is set up one clock cycle earlier and is incremented every eight clock cycles.

Figure 3A:
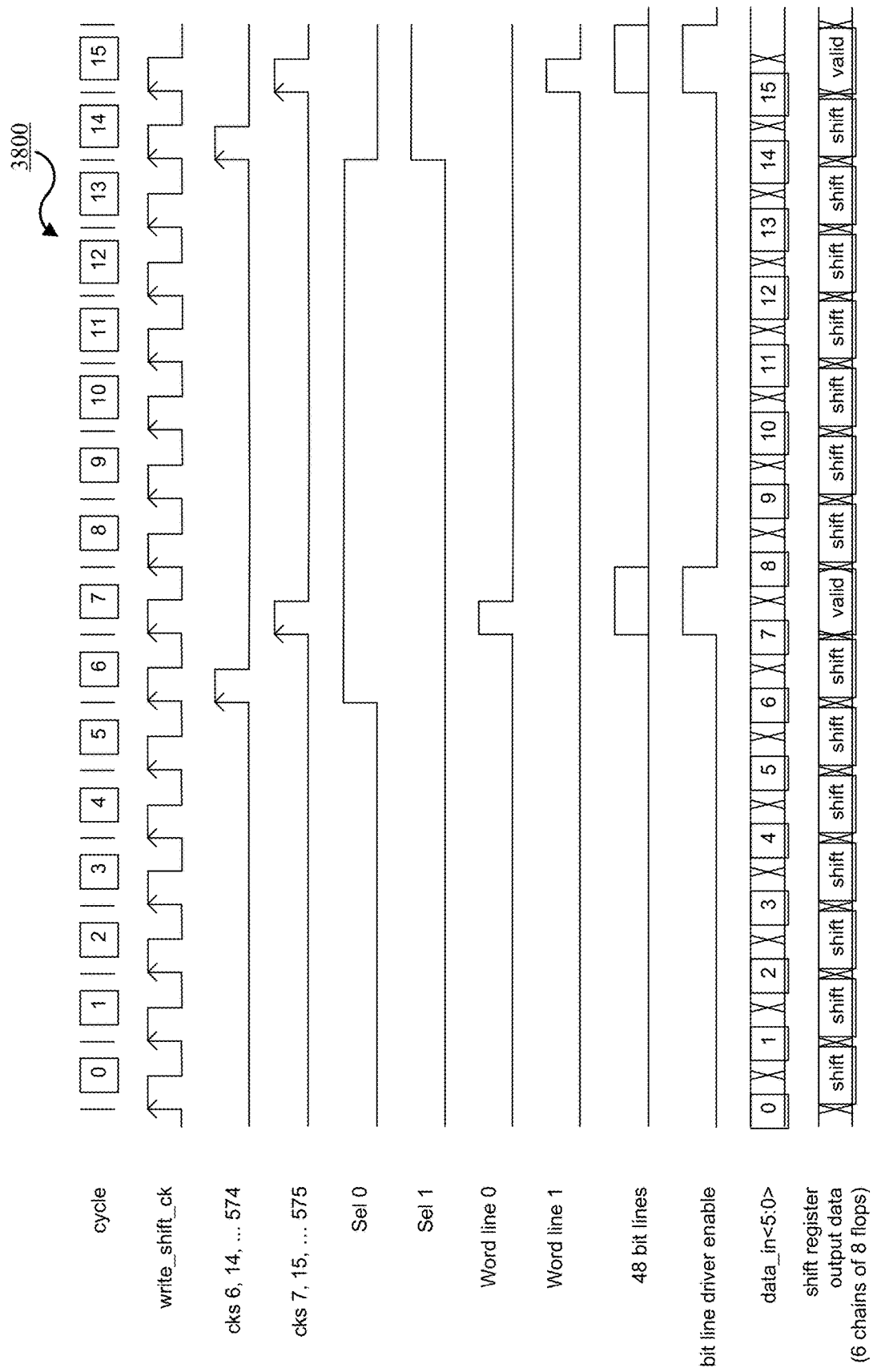
FIG. 3A is a block diagram of an example timing diagram for a write port architecture in accordance with embodiments of this disclosure.

FIG. 3A is a block diagram of an example timing diagram 3800 for a write port architecture 3000 in accordance with embodiments of this disclosure. As shown in FIG. 3 and FIG. 3A, clocks 7 (the eighth clock cycle), 15 (the sixteenth clock cycle), etc., are shipped horizontally to all 72 AND gates to drive the vertical word lines (latch enables). Only one AND gate at a time toggles. This is enabled by the selects produced by clocks 6 (the seventh clock cycle), 14 (the fifteenth clock cycle), etc. All selects start low. Select 0 rises on the seventh clock cycle (clock 6) and falls on the fifteenth clock cycle (clock 14). Select 1 rises coincident with select 0 falling; select 1 falls on the 23rd clock cycle (clock 22), etc. That is, the high select shifts over one position for each rising clock edge it receives.

FIG. 4 is a block diagram of an example of a read port architecture or circuit 4000 in accordance with embodiments of this disclosure. The read port architecture or circuit 4000 is configured as 576 addresses with 6 differential outputs ($D_{out}$ and complementary $D_{out}$), i.e., 12 bits in total. The read port architecture or circuit 4000 includes a divide by 8 selector 4100, a wraparound shift register 4200, and read port output blocks 4300$_{1-6}$. In implementations, the wraparound shift register 4200 is a 72 bit shift register. Each of the read port output blocks 4300$_{1-6}$ includes multiplexor blocks 4310$_{1-8}$, D flip-flops 4320$_{1-8}$, a rate changing multiplexor 4330, a data D flip-flop 4340, a data_out delay gate 4350, a data_out inverter 4360, and a test D flip-flop 4370. Each of the multiplexor blocks 4310$_{1-8}$ includes latches 4312 and a multiplexor 4314. In implementations, there are 72 latches 4312 and the multiplexor 4314 is a 72 to 1 multiplexor.

The divide by 8 selector 4100 is connected to a clock input of the wraparound shift register 4200, each of the D flip-flops $4320_{1-8}$, and to each rate changing multiplexor 4330. Selector outputs 4210 of the wraparound shift register 4200 are connected to one of the latches 4312 (48 sets of 72 latches), which are in turn connected to the multiplexor 4314. The outputs of each of the multiplexors 4314 are connected to one of the D flip-flops $4320_{1-8}$. The outputs of the D flip-flops $4320_{1-8}$ are connected to the rate changing multiplexor 4330, which in turn is connected to the data D flip-flop 4340. The output of the data D flip-flop 4340 is connected to the data_out delay gate 4350, the data_out inverter 4360, and the test D flip-flop 4370.

The read port architecture or circuit 4000 includes two inputs, a read_clock (rck) 4400 and a read_enable 4500. The read_enable 4500 is connected to the divide by 8 selector 4100 and to the wraparound shift register 4200 via an inverter gate 4700 to function as a reset signal. The read_clock (rck) 4400 is a high-speed clock. In implementations, the read_clock (rck) 4400 is $f_{MEMORY}$. In implementations, in this instance, the read_clock (rck) 4400 can range from 3.028 GHz to 3.289 GHz. The rck 4400 is input to the divide by 8 selector 4100 and the data D flip-flop 4340. The divide by 8 selector 4100 generates a rck/8 clock 4410 which is connected to the clock input of the wraparound shift register 4200 and also generates eight rck/8 ⅛th duty cycle selects 4420 connected to each rate changing multiplexor 4330. The test D flip-flop 4370 is connected to a rck/576 clock as described herein.

Some definitional aspects for FIG. 4. The rck/8 clock is the input clock divided by eight (a clock 8× slower than rck clock) but with a proper 50% duty cycle. With respect to the rate changing multiplexor 4330, when one select falls, another select rises (similar to the selects described herein for the write port architecture). Due to the ⅛th duty cycle, there is a "select falling/the next select rising coincidental edges" every rck rising edge. The terminology in the shift register 4200 (Wrap-around shift register read selector/One in a field of zeros) is almost identical to the same function in the write port. That is, the selects shift over one position for every rising clock edge received. In the read port case, with no follow-on AND gates, the selects will stay high for the full rck/8 period. Moreover, the wrap around path means that the shift register 4200 counts 0 to 71 repeatedly. The multiplexor blocks $4310_{1-8}$ are shown such that the circuitry within each multiplexor block $4310_{1-8}$ is for one row by 72 columns of latches. The x8 block multiplier takes it up to 8 rows by 72 columns of latches. Similarly, the x8 on the D flip-flops $4320_{1-8}$ means 8 parallel flops. The x6 takes it up to 48 rows by 72 columns of latches. The 72 to 1 multiplexor 4314 (72 data inputs, 72 selects) is the digital logic equivalent of a traditional memory's one-per-memory-cell-per-bit-line NFET pass transistors, plus the wired OR bit line, for a bit line loaded with 72 SRAM cells in this case. To supply fast edges and achieve full rail swing, the 72 to 1 multiplexor 4314 is six inverting digital logic cells deep. Physically, this means a row of latches, then a row for the 72 to 1 mux gates, then a row of latches, etc.

As noted, the read port architecture or circuit 4000 is high-speed port. The read port architecture or circuit 4000 continually traverses the address space in a loop from 0 to 575 using continuous sequential automatic addressing from 0 to 575 and therefore requires no read address bus.

Operationally, a 48-bit word is read from a column of the storage array (i.e., all of the latches 4312) at a rate of rck/8. The 48-bit word is processed through the rate changing multiplexors 4330, which operate at the rck rate to sequentially process the eight 6-bit words stored in the column and export or output a 6-bit (differential) output word at rate rck ($D_{OUT}$ and complementary $D_{OUT}$). The read operation is pipelined twice: once, at the rck/8 rate, at the output of the storage array and once, at the rck rate, at the output of the multiplexors 4330. The first stage of pipelining provides consistent data handoff timing to the multiplexors 4330 while the latter pipelining equalizes the eye widths by removing any path delay differences through the 8 inputs of the multiplexors 4330.

In implementations, a lower-speed commercially off-the-shelf (COTS) 1PSRAM can be used with the appropriate configuration. For example, in this instance, 72 addresses by 48-bit words. The COTS 1PSRAM would be clocked at a rate of rck/8. The COTS 1PSRAM can be preceded by write data shift registers if the overall write data port width is to be maintained at 6 bits. The COTS 1PSRAM would be followed by rate-shifting multiplexors operating at the rate rck. A memory controller would cycle through the addresses, continually in read mode, or just once in write mode.

In implementations, a single port can be used in contrast to a write port and a read port since the write port is turned off once completed. The single port would be used for both the write cycle and the read cycle.

Figure 5:
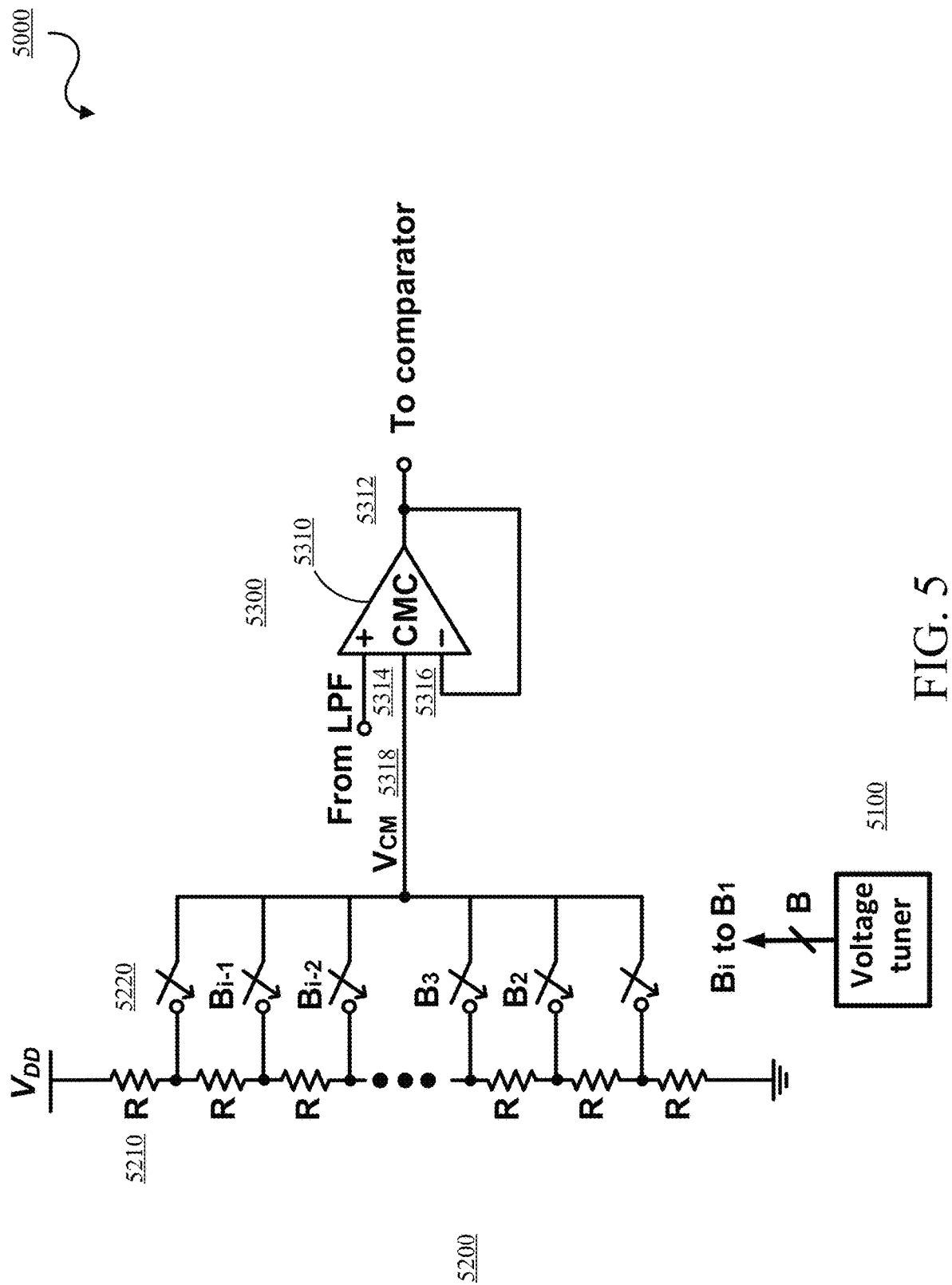
FIG. 5 is a block diagram of an example of a resistor ladder and common-mode correction in accordance with embodiments of this disclosure.

FIG. 5 is a block diagram of an example of a tunable common-mode correction circuit 5000 in accordance with embodiments of this disclosure. The tunable common-mode correction circuit 5000 includes a voltage tuner 5100, a resistor ladder 5200, and common-mode correction circuit 5300. In implementations, the common-mode correction circuit 5300 is an operational amplifier 5310 having an output 5312 connected to a comparator, such as the comparator 2240 in FIG. 1, a positive terminal 5314 connected to an output of an LPF, such as the LPF 2220 of FIG. 1, and a negative terminal 5316 connected to the output 5312. The resistor ladder 5200 includes resistors 5210 serially connected together between $V_{DD}$ and ground. One end of a switch 5220 is connected between a pair of the resistors 5210 and a remaining end is connected to common-mode voltage ($V_{CM}$) terminal 5318 of the operational amplifier 5310. Each switch 5220 is connected to the voltage tuner 5100. The voltage tuner 5100 is controlled by a digital core, such as the digital core 2300 in FIG. 1.

Operationally, a duty cycle of the output clock ($f_{DDFS}$) can be adjusted by controlling, via the voltage tuner 5100, which switches 5220 are connected/disconnected in the resistor ladder 5200. By increasing the $V_{CM}$ to a higher voltage, the comparator compares an input signal with the increased $V_{CM}$, which decreases the duty cycle. On the other hand, if B2 is ON as an example, the comparator compares the input signal with a lower $V_{CM}$, and which increases the duty cycle.

Figure 6:
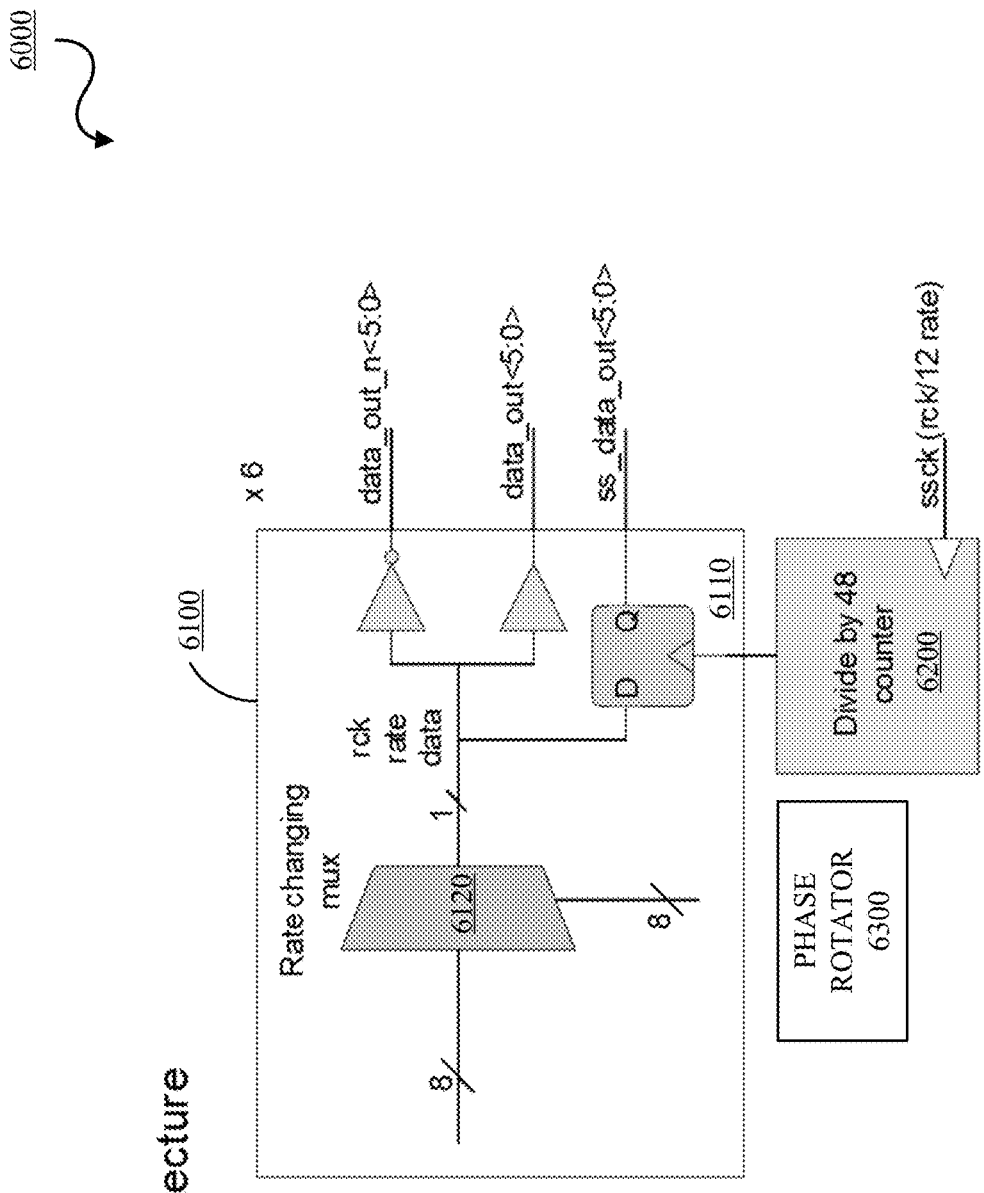
FIG. 6 is a block diagram of an example of a test port architecture in accordance with embodiments of this disclosure.

FIG. 6 is a block diagram of an example of a test port architecture 6000 in accordance with embodiments of this disclosure. The test port architecture 6000 includes a test D flip-flop 6110 for each read port output block $6100_{1-6}$, where each test D flip-flop 6110 is provided a rck/576 clock by a divide by 48 counter 6200. The divide by 48 counter 6200 divides down a rck/12 clock (which is a sample scope clock) to produce the rck/576 clock, which is the repeat frequency of the entire read address space in this instance. A data input 6112 of the test D flip-flop 6110 is connected to an output of a rate changing multiplexor 6120. An output 6114 of the test D flip-flop 6110 is provided to a digital core or external device.

Operationally, verification of correct at-speed read operation of the storage or memory is provided by sampling the positive phase memory outputs. As noted, the clock to each of the test D flip-flops 6110 has a frequency equivalent to the repeat rate of the memory pattern, or rck/576. A position of the rising edge of this clock (rck/576) can be continually moved in small increments by a phase controller or rotator 6300, allowing the output pattern to be "sample-scoped." That is, during the read operation, the memory contents can be verified at speed by moving the position of the rising edge of the sample scope clock across the full 576-address pattern, recording the values of ss_data_out<5:0> at each position. The pattern can be traced out with multiple points per output word, or for minimal data points. The center of an output word can be found and then the sample scope clock rising edge can be moved a calculated interval to be in the middle of the next output word, and so on.

Figure 7:
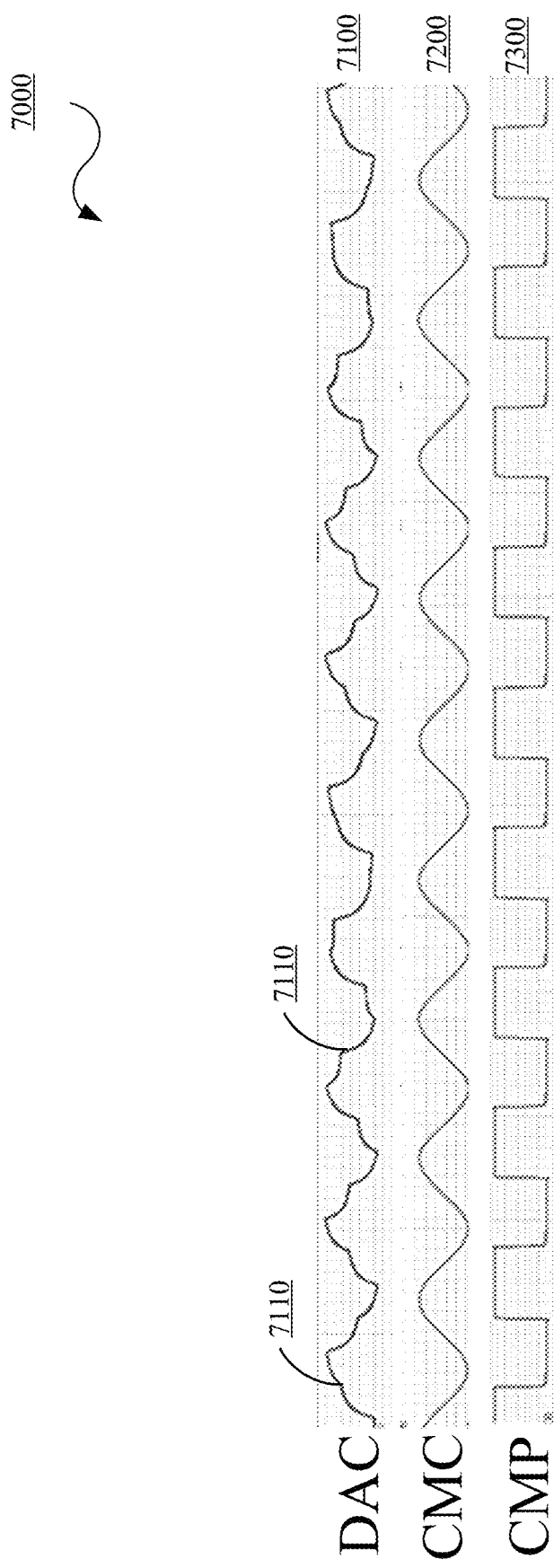
FIG. 7 are diagrams of example waveforms in accordance with embodiments of this disclosure.

FIG. 7 are diagrams of example waveforms in accordance with embodiments of this disclosure. In this modeling instance, $f_{MEMORY}$=3.125 GHz, N=576 and M=95 to achieve a desired output frequency ($f_{DDFS}$) at 515.408 MHz. The $V_{CM}$ is set at a middle level in order to receive 50% duty cycle. The example waveforms are an output waveform 7100 from a DAC, an output waveform 7200 from a CMC, and an output waveform 7300 ($f_{DDFS}$) from a comparator (CMP). The output waveform 7100 shows the discontinuities 7110 between the sampled multiple copies (i.e., the periodicity or M number) of the desired pattern. The output waveform 7200 shows a filtered or smoothed output waveform. The output waveform 7300 shows the $f_{DDFS}$ having the desired duty cycle. The results show that the RMS jitter is 2.03 psec peak to peak and period jitter is 12.71 psec when the noise of the system is activated.

Figure 8:
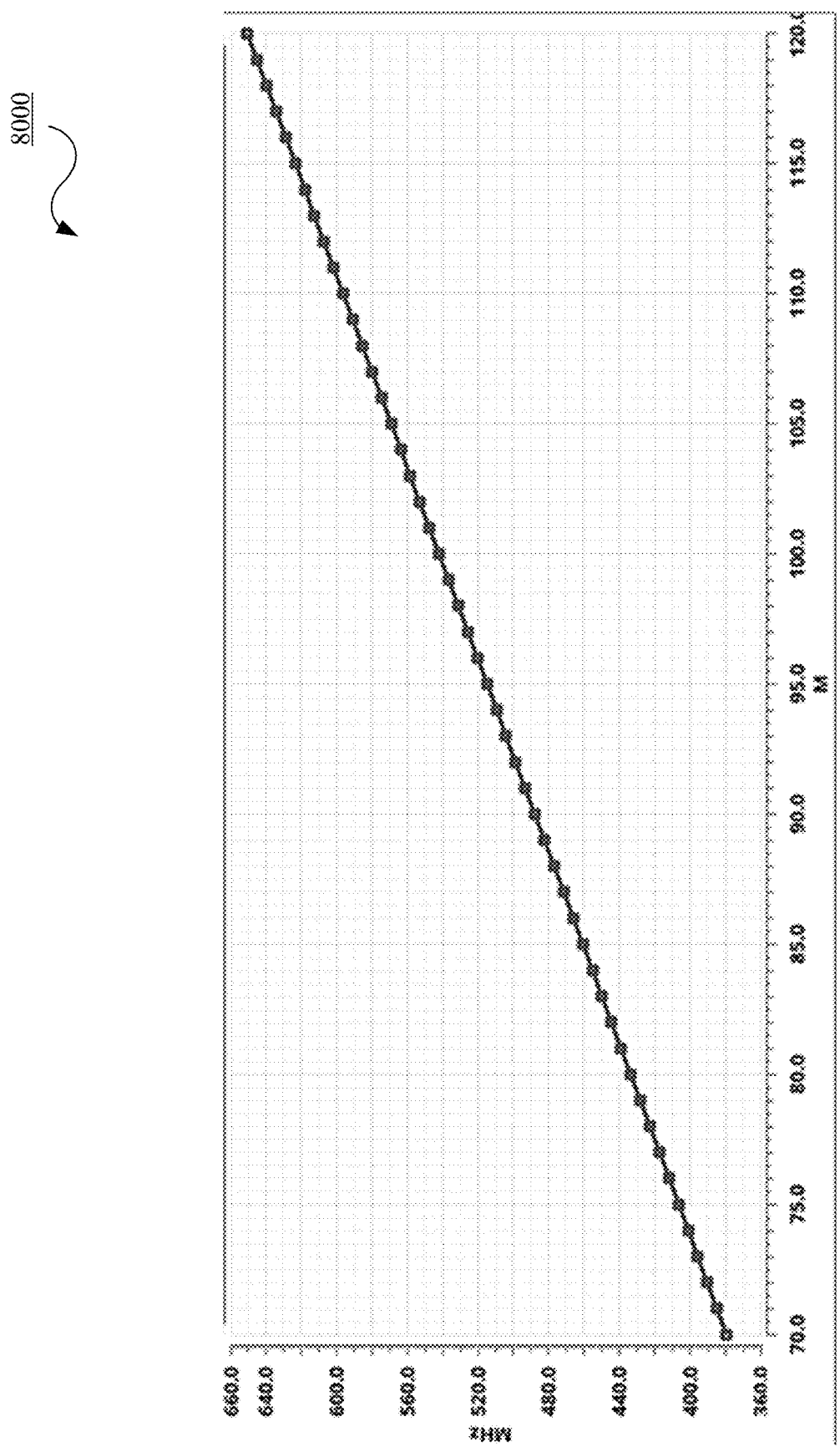
FIG. 8 is a graph of an example of different M values in accordance with embodiments of this disclosure.

FIG. 8 is a graph of an example of different M values in accordance with embodiments of this disclosure. This shows that by changing the number of periods encoded in the memory, M, different frequencies can be achieved. In this instance, the values of N and $f_{MEMORY}$ are fixed and equal to 576 and 3.125 GHz, respectively.

Figure 9:
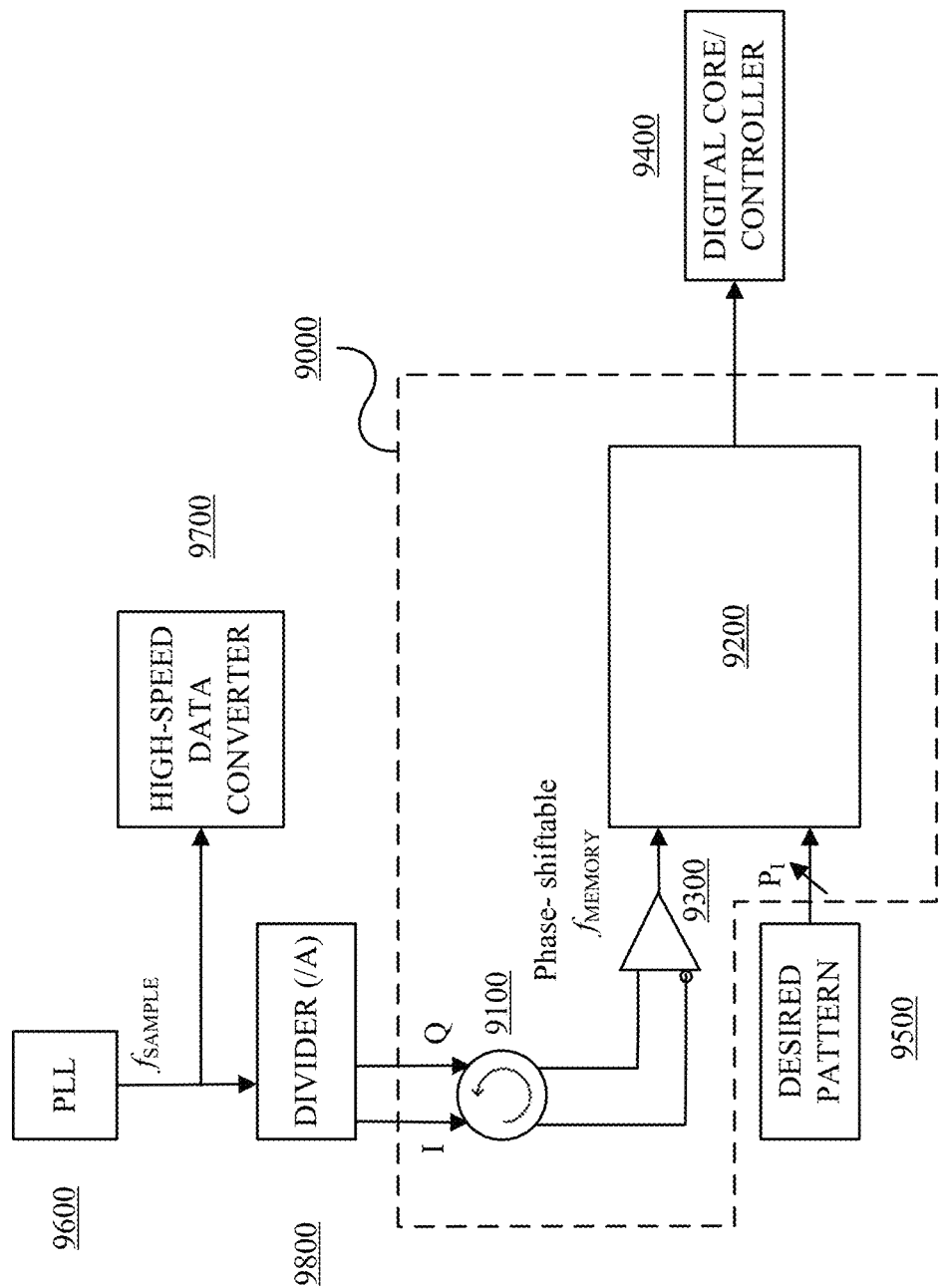
FIG. 9 is a block diagram of a DDFS with phase rotator in accordance with embodiments of this disclosure.

FIG. 9 is a block diagram of a DDFS 9000 with a phase rotator in accordance with embodiments of this disclosure. In implementations, the DDFS 9000 includes a phase rotator 9100, a differential-to-single-ended converter (DSC) 9200, and a DDFS block 9300. The DDFS block 9300 works similar to the DDFS circuit 2000 of FIG. 2 and outputs a $f_{DDFS}$ clock to a digital core 9400. The DDFS block 9300 is connected to a register 9500, where the register 9500 includes one or more desired patterns. Differential outputs of the phase rotator 9100 are connected to the DSC 9200, which in turn is connected to the DDFS block 9300 to provide the $f_{MEMORY}$ clock. In implementations, the phase rotator 9100 and the DSC 9200 are implemented as a current mode logic (CML)-based differential to single-ended circuit. In implementations, the phase rotator 9100 is controlled by or via the digital core 9400 or the like.

As in FIG. 2, a read port architecture in the DDFS block 9300 operates using the $f_{MEMORY}$ clock. The $f_{MEMORY}$ clock is generated from the $f_{SAMPLE}$ clock. As before, the $f_{SAMPLE}$ clock is provided by a PLL 9600, where the $f_{SAMPLE}$ clock is used by a high-speed data converter 9700, for example. However, a divider 9800 is needed to divide down the $f_{SAMPLE}$ clock as the digital core 9400 operates at frequencies lower than the $f_{SAMPLE}$ clock. The divider 9800 provides a divided down differential $f_{SAMPLE}$ clock to the phase rotator 9100, which can apply fine phase offset or fine phase tuning of the divided down differential $f_{SAMPLE}$ clock. The phase rotator 9100 can provide fine resolution by spinning the phase rotator ($\Delta f=(\Delta\emptyset)/\Delta t$) without changing the size of the memory. Therefore, the $f_{SAMPLE}$ clock can be locked in a fashion similar to that of a PLL or delay-locked loop (DLL). The DSC 9200 can convert the differential output of the phase rotator 9100 to a single-ended $f_{MEMORY}$ clock, which can be used by the DDFS block 9300.

The phase rotator 9100 enables application of an offset on the phase of the divided down $f_{SAMPLE}$ clock, i.e., phase tuning. This does not change the frequency of the divided down $f_{SAMPLE}$ clock. The digital core can be used to check the phase difference between $f_{SAMPLE}$ clock and $f_{DDFS}$ clock. In the event the phases are not synchronized, the digital core can control the phase rotator 9100 to rotate the phase of the divided down $f_{SAMPLE}$ clock as appropriate without incurring additional jitter.

Figure 10:
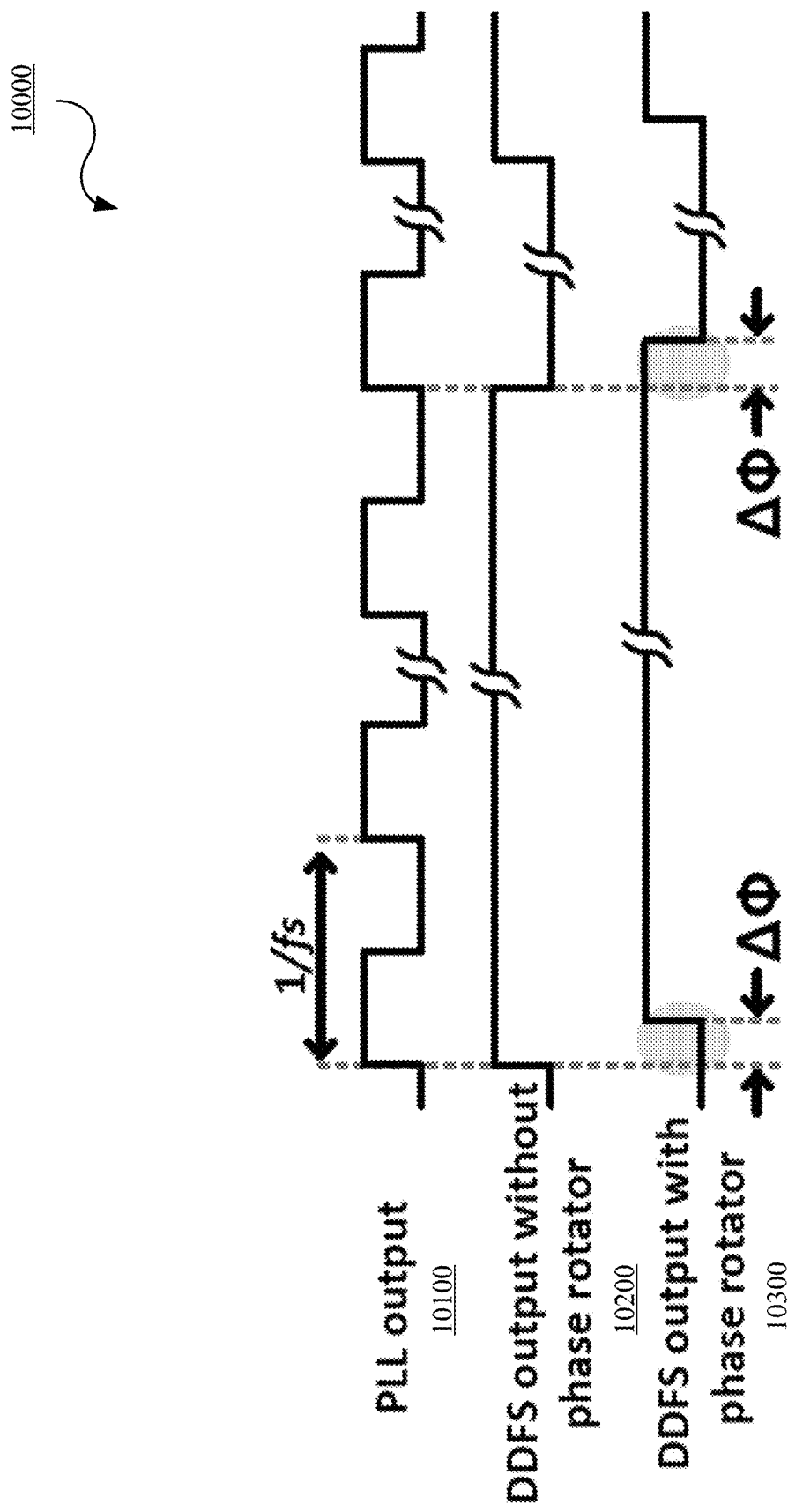
FIG. 10 are diagrams of example waveforms in accordance with embodiments of this disclosure.

FIG. 10 are diagrams of example waveforms 10000 for the DDFS 9000 with the phase rotator 9100 in accordance with embodiments of this disclosure. The waveforms 10000 include a PLL output waveform 10100, a DDFS output waveform 10200 with no phase rotation, and a DDFS output waveform 10300 with phase rotation. Application of a phase rotation to the PLL output waveform 10100 by the phase rotator shifts the phase of the resulting DDFS output waveform as shown by comparing the DDFS output waveform 10200 with the DDFS output waveform 10300.

Figure 11:
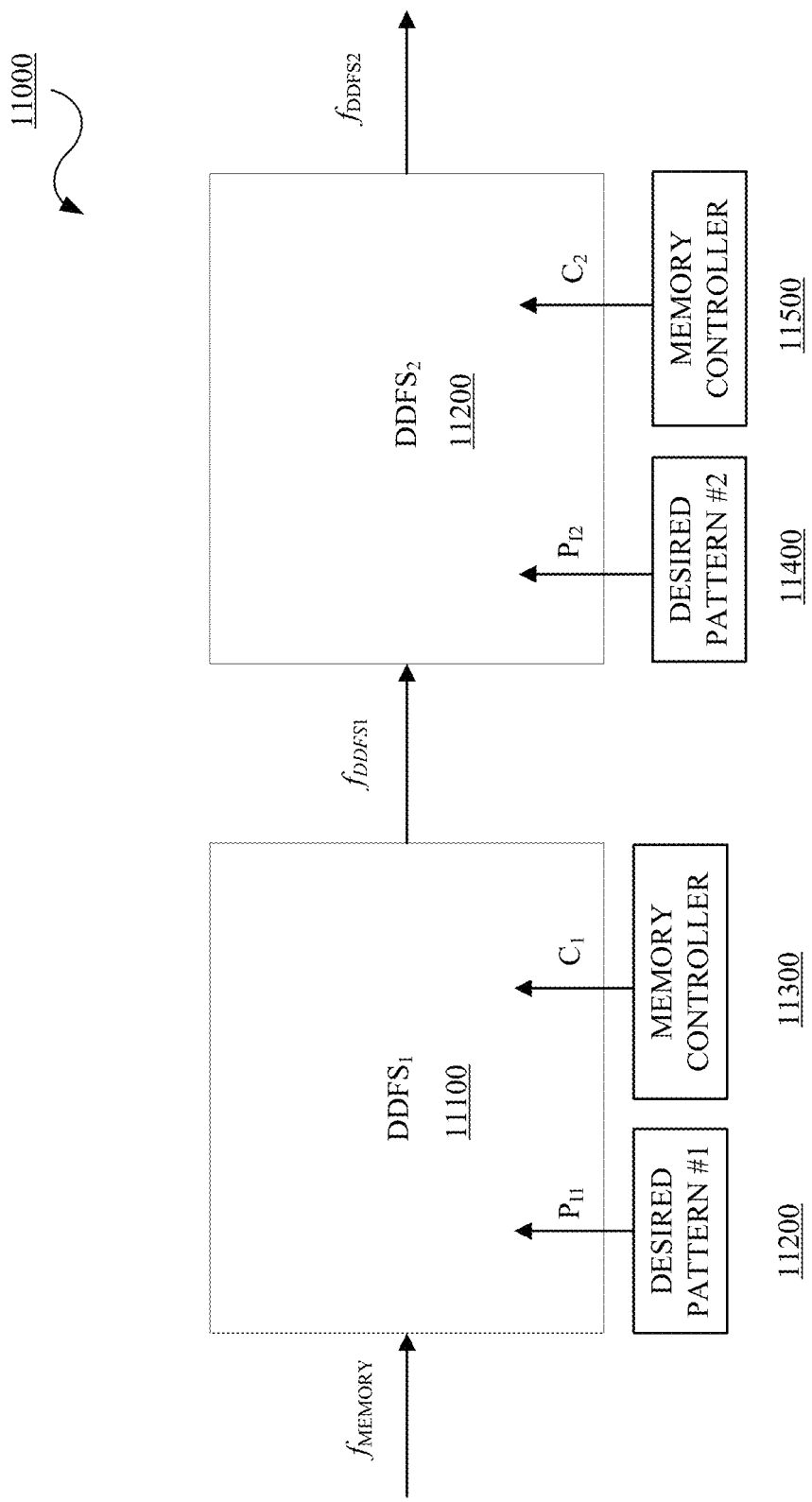
FIG. 11 is a block diagram of a cascaded DDFS in accordance with embodiments of this disclosure.

FIG. 11 is a block diagram of a cascaded DDFS 11000 in accordance with embodiments of this disclosure. In implementations, the cascaded DDFS 11000 includes a $DDFS_1$ 11100 connected to a $DDFS_2$ 11200. In implementations, the number of cascaded DDFS' are variable. In implementations, the $DDFS_1$ 11100 and the $DDFS_2$ 11200 can be the DDFS circuit 2000, the DDFS 9000, and/or combinations thereof. In implementations, the $DDFS_1$ 11100 and the $DDFS_2$ 11200 can have different and/or same values of M and N as described herein. The $f_{MEMORY}$ clock is provided as described herein to the $DDFS_1$ 11100, which outputs a $f_{DDFS1}$ clock using a desired pattern #1 from register 11300 as controlled by memory controller 11400. The $f_{DDFS1}$ clock can be used as the $f_{MEMORY}$ clock for the $DDFS_2$ 11200, which outputs a $f_{DDFS2}$ clock using a desired pattern #2 from register 11400 as controlled by memory controller 11500.

Figure 12:
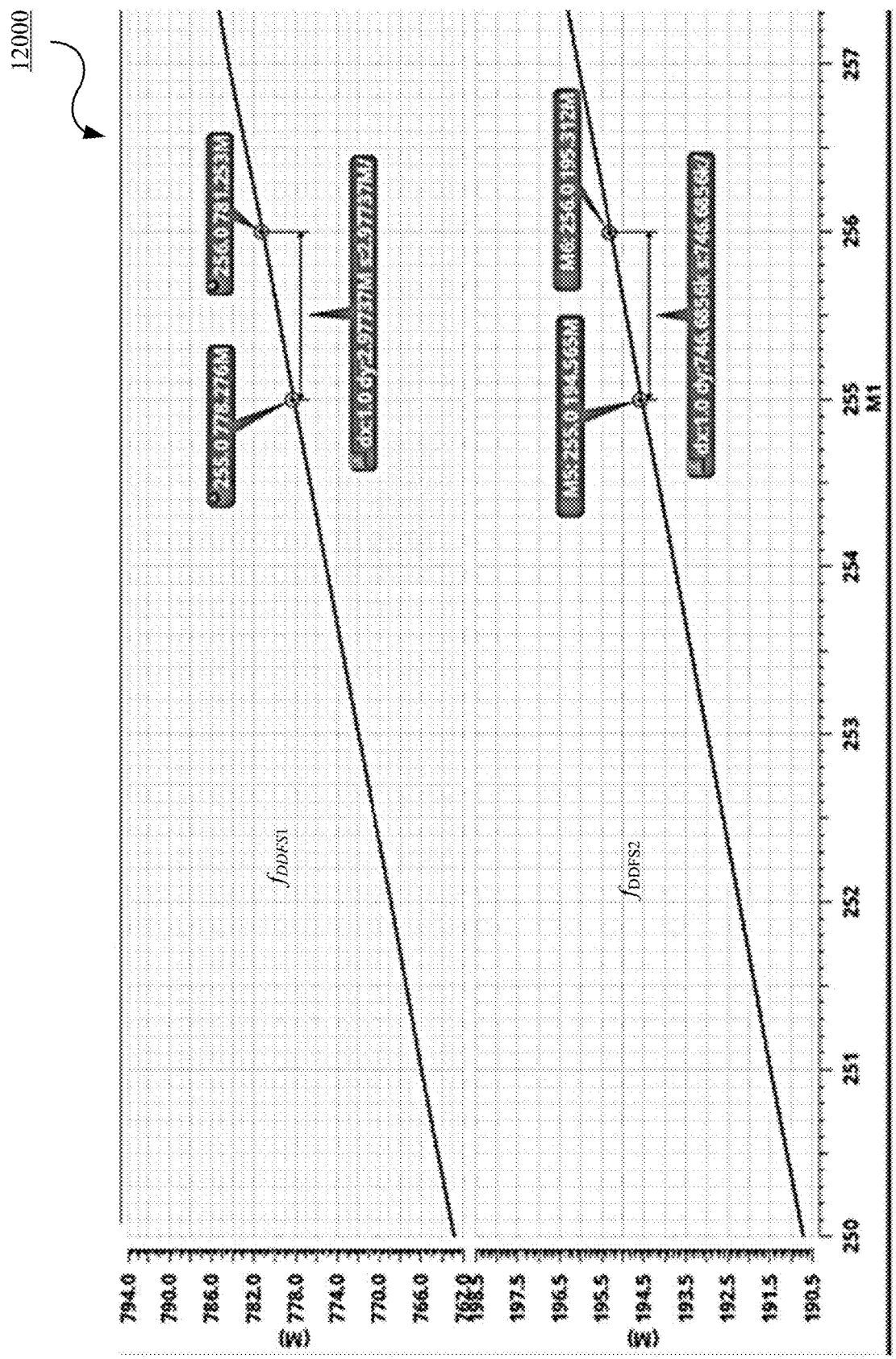
FIG. 12 are example graphs in accordance with embodiments of this disclosure.
Figure 13:
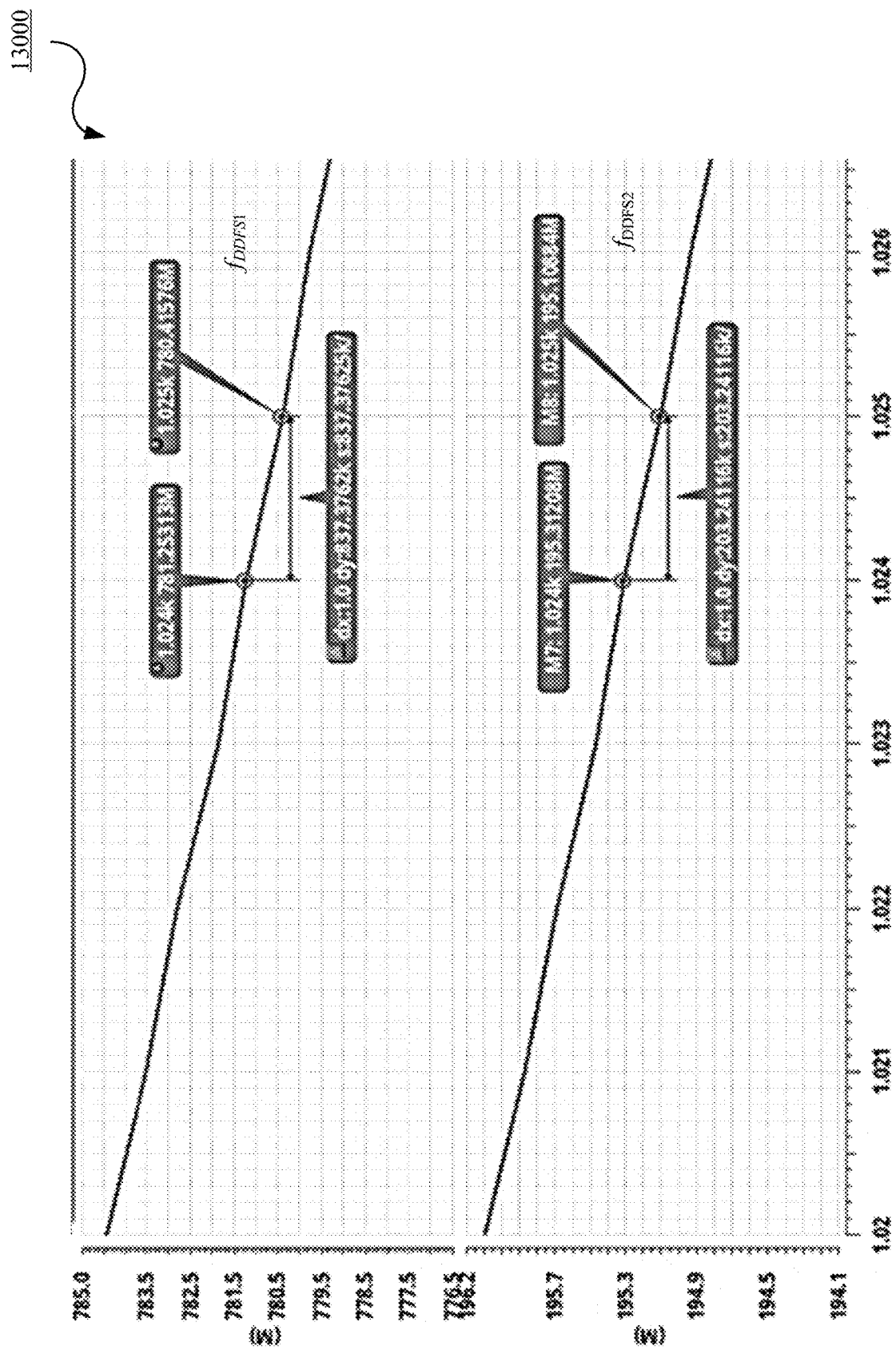
FIG. 13 are example graphs in accordance with embodiments of this disclosure.

The cascaded DDFS 11000 increases the resolution of frequency and phase. FIG. 12 and FIG. 13 are diagrams of example graphs 12000 and 13000, respectively, in accordance with embodiments of this disclosure. The graphs 12000 and 13000 show the frequency versus a changing M1 and the frequency versus a changing N1, respectively, for the $f_{DDFS1}$ clock and the $f_{DDFS2}$ clock. FIG. 12 shows the simulation results for N1=N2=1024, M2=254, and M1 is changing from 250 to 260. With this setup, an output frequency resolution of 746.68 KHz is achieved for the $f_{DDFS2}$ clock. FIG. 13 uses the same arrangement but N1 is changing from 1020 to 1030. The output frequency resolution is then 203.24 KHz for the $f_{DDFS2}$ clock.

Figure 14:
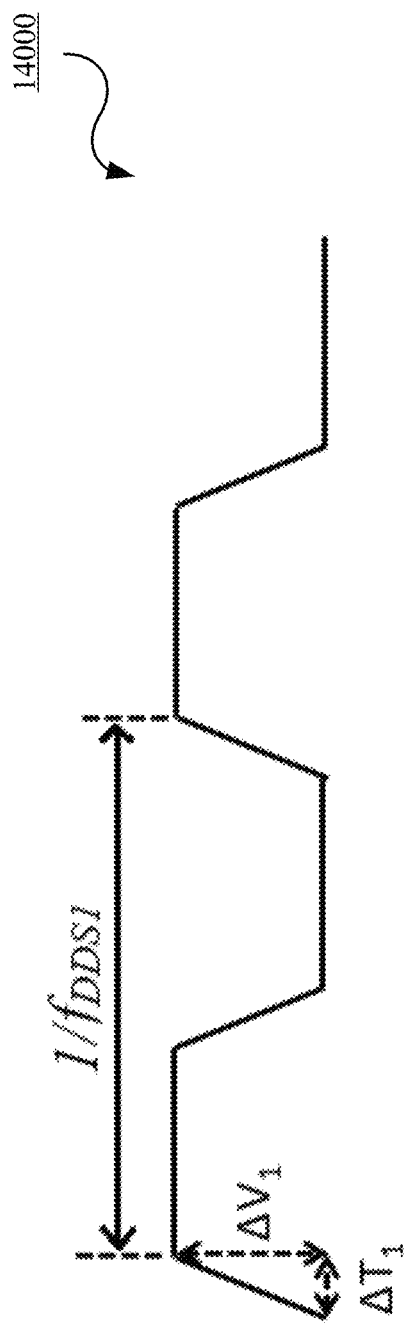
FIG. 14 and FIG. 15 are diagrams of an example frequency scaling in accordance with embodiments of this disclosure.
Figure 15:
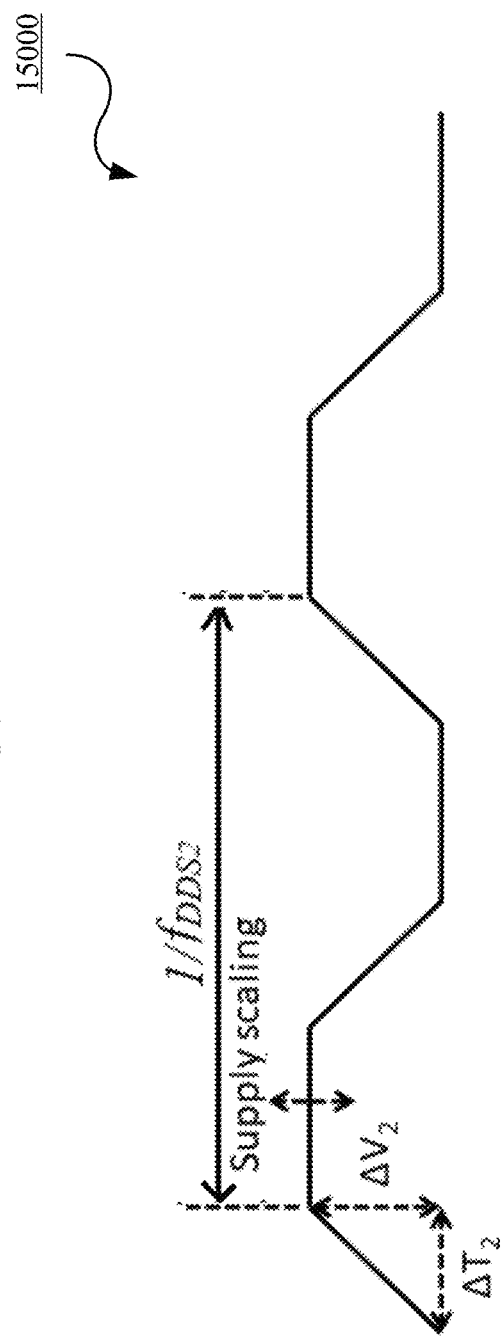

The DDFS circuits described herein provide or enable supply and power scaling for the digital core it is driving based on frequency. As shown in FIGS. 14 and 15, as $$f_{DDS} = f_{mem} \times \frac{M}{N}$$

is scaled, an edge rate (rise or fall time) can also be scaled proportionally, which allows for voltage/power scaling. FIG. 14 shows, for a high frequency clock 14000, that a sharp edge is needed which requires higher supply/power to charge the capacitor load at $\Delta T_1$, in contrast to, FIG. 15 which shows, for a low frequency clock 15000, that a sharp edge is not needed and the supply/power can be scaled downward to save power because of a longer $\Delta T_2$.

Figure 16:
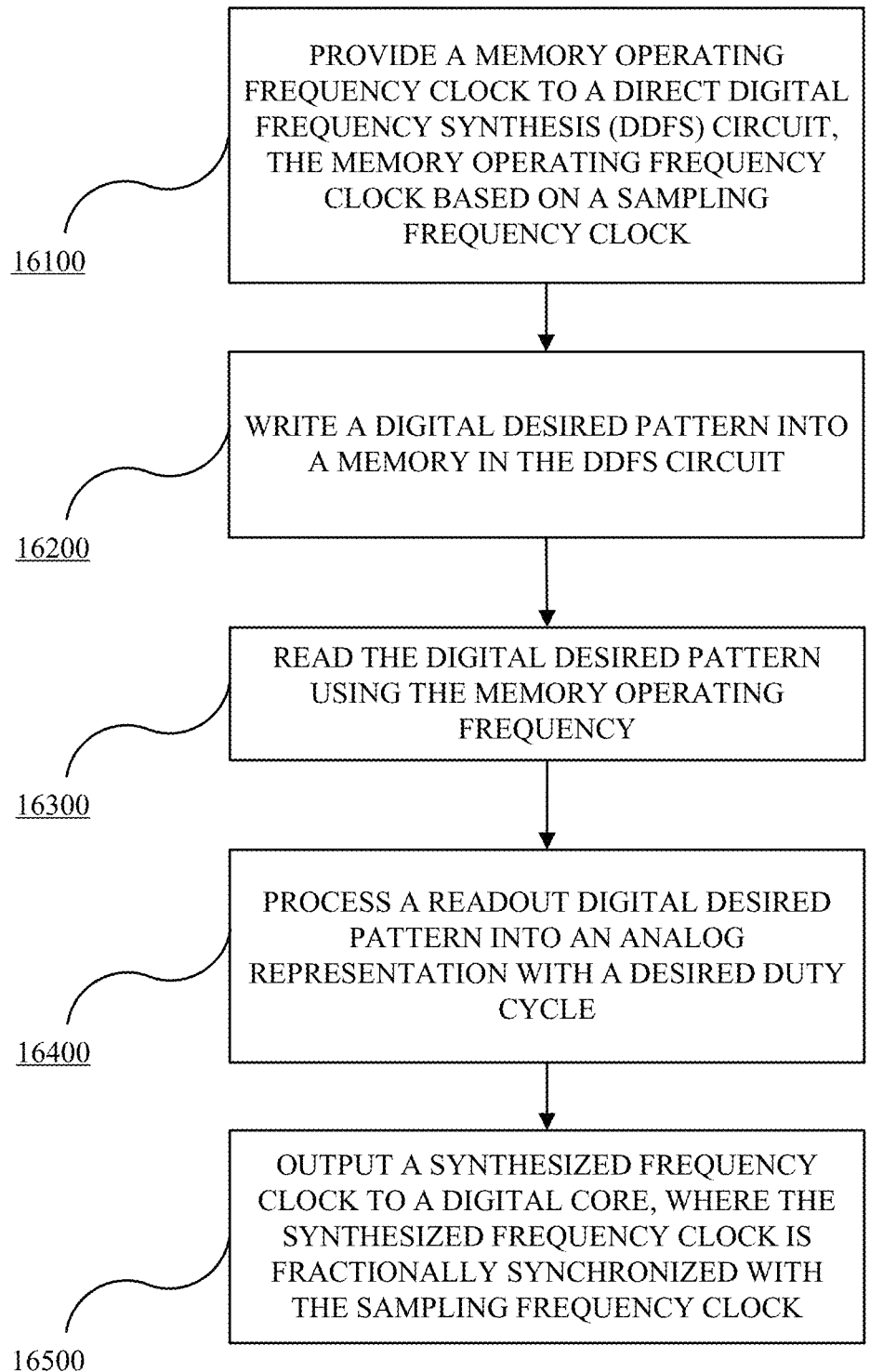
FIG. 16 is a flowchart of an example technique for DDF in accordance with embodiments of this disclosure.

FIG. 16 is a flowchart of an example method 16000 for DDFS in accordance with embodiments of this disclosure. The method 16000 includes: providing 16100 a memory operating frequency clock to a direct digital frequency synthesis (DDFS) circuit, the memory operating frequency clock based on a sampling frequency clock; writing 16200 a digital desired pattern into a memory in the DDFS circuit; reading 16300 the digital desired pattern using the memory operating frequency clock; processing 16400 a readout digital desired pattern into an analog representation with a desired duty cycle; and outputting 16500 a synthesized frequency clock to a digital core, where the synthesized frequency clock is fractionally synchronized with the sampling frequency clock. The method 16000 can be implemented by the DDFS architecture and/or circuit 2000, the write port architecture or circuit 3000, the read port architecture or circuit 4000, the tunable common-mode correction circuit 5000, the test port architecture 6000, the DDFS 9000, and the cascaded DDFS 11000, as appropriate and applicable.

The method 16000 includes providing 16100 a memory operating frequency clock to a direct digital frequency synthesis (DDFS) circuit, the memory operating frequency clock based on a sampling frequency clock. In implementations, the sampling frequency clock is also used by a high-speed data converter, thus establishing inherent synchronization with a synthesized frequency clock. The sampling clock is divided down to create the memory operating frequency clock. In implementations, a divided down sampling clock is phase adjusted to create the memory operating frequency clock. In a cascaded architecture, a synthesized frequency clock from one direct digital frequency synthesis (DDFS) circuit is the memory operating frequency clock for another direct digital frequency synthesis (DDFS) circuit.

The method 16000 includes writing 16200 a digital desired pattern into a memory in the DDFS circuit. In implementations, digital desired patterns are generated based on resolution requirements, frequency requirements for the synthesized frequency clock, and the like. In implementations, different synthesized frequency clocks can be achieved by changing the number of periods, M, encoded in a memory having N addresses or address spaces. Each value of M is a digital desired pattern. The frequency of the synthesized frequency clock is determined from the memory operating frequency clock, the value of M, and the value of N. In implementations, the writing of the digital desired pattern into the memory is done with one-pass sequential automatic addressing from 0 to N−1 in N write cycles. In implementations, a write port can then be turned off or shut down. In implementations, the writing of the digital desired pattern into the memory is deterministic from 0 to N−1.

The method 16000 includes reading 16300 the digital desired pattern using the memory operating frequency clock. In implementations, the stored digital desired pattern is readout using the memory operating frequency clock by continually traversing the address space in a loop. In implementations, the stored digital desired pattern is readout using the memory operating frequency clock by using continuous sequential automatic addressing from 0 to N−1.

The method 16000 includes processing 16400 a readout digital desired pattern into an analog representation with a desired duty cycle. In implementations, an analog representation of the readout digital desired pattern is generated by a DAC. The analog representation is filtered by an LPF. Common-mode correction is applied to the filtered analog representation by a common-mode correction circuit. In implementations, a duty cycle of the filtered analog representation can be adjusted during common-mode correction.

The method 16000 includes outputting 16500 a synthesized frequency clock to a digital core, where the synthesized frequency clock is fractionally synchronized with the sampling frequency clock. In implementations, a comparator generates the synthesized frequency clock from the output of the common-mode correction circuit.

Figure 17:
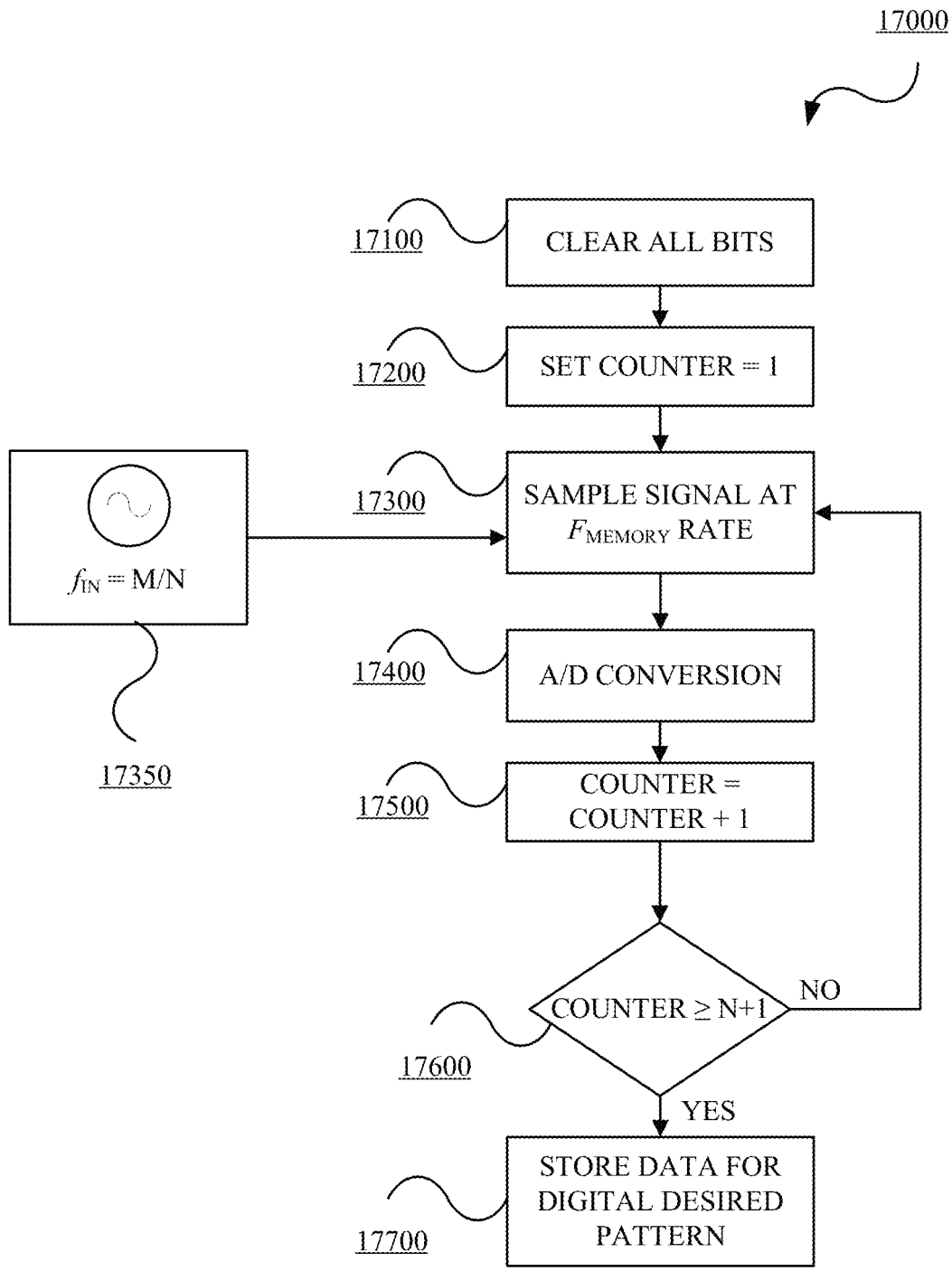
FIG. 17 is a flowchart of an example technique for template generation in accordance with embodiments of this disclosure.

FIG. 17 is a flowchart of an example method 17000 for digital desired pattern or template generation in accordance with embodiments of this disclosure. The method 17000 includes: clearing 17100 all bits in N memory addresses; setting 17200 an address counter to 1; sampling 17300 an input frequency based on M and N from a frequency oscillator 17350; converting 17400 a sampled frequency to a digital representation; incrementing 17500 the address counter; checking 17600 if N+1 addresses haven been generated; and storing 17700 data for digital desired pattern when N+1 samples are generated. The method 17000 can be implemented by the DDFS architecture and/or circuit 2000, the write port architecture or circuit 3000, the read port architecture or circuit 4000, the tunable common-mode correction circuit 5000, the test port architecture 6000, the DDFS 9000, and the cascaded DDFS 11000, as appropriate and applicable.

The method 17000 includes clearing 17100 all bits in N memory addresses. A memory or storage for holding digital desired patterns is initialized.

The method 17000 includes setting 17200 an address counter to 1. A counter is initialized.

The method 17000 includes sampling 17300 an input frequency based on M and N from a frequency oscillator 17350. A frequency oscillator 17350 generates a frequency based on the relationship between M and N. Samples are taken at a memory operating frequency clock.

The method 17000 includes converting 17400 a sampled frequency to a digital representation. Samples are converted by an analog-to-digital converter (ADC).

The method 17000 includes incrementing 17500 the address counter.

The method 17000 includes checking 17600 if N+1 addresses haven been generated. Samples are taken until N+1 samples have been taken and converted.

The method 17000 includes storing 17700 data for digital desired pattern when N+1 samples are generated. The digital desired pattern is stored for use in a DDFS.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more the computer readable mediums having the computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A direct digital frequency synthesizer comprising:
   a memory with N address spaces;
   a write port circuit configured to sequentially write a digital desired pattern into the N address spaces;
   a read port circuit configured to readout the digital desired pattern from the N address spaces using continuous sequential automatic addressing from 0 to N−1 at a memory operating frequency clock, wherein the memory operating frequency clock is based on a sampling frequency clock used for high-speed data processing; and
   an analog signal processing circuit configured to
      process a readout digital desired pattern into an analog representation; and
      output a synthesized frequency clock from the analog representation to a digital core, wherein the synthesized frequency clock is fractionally synchronized with the sampling frequency clock.

2. The direct digital frequency synthesizer of claim 1, further comprising
   a divider configured to divide down the sampling frequency clock to generate the memory operating frequency clock.

3. The direct digital frequency synthesizer of claim 1, further comprising
   a phase rotator configured to rotate a phase of a divided down sampling frequency clock to generate the memory operating frequency clock.

4. The direct digital frequency synthesizer of claim 1, the analog signal processing circuit further comprising a tunable common-mode correction circuit configured to adjust a duty cycle of the synthesized frequency clock.

5. The direct digital frequency synthesizer of claim 1, the analog signal processing circuit further comprising
   a common-mode correction circuit;
   a resistor ladder connected to a common-mode voltage input of the common-mode correction circuit; and
   a voltage tuner connected to resistor ladder, the voltage tuner configured to control a configuration of the resistor ladder which adjusts the common-mode voltage input to set a duty cycle of the synthesized frequency clock.

6. The direct digital frequency synthesizer of claim 1, wherein the write port circuit and the read port circuit use a single port.

7. The direct digital frequency synthesizer of claim 1, wherein a port used for writing the digital desired pattern into the memory is shut down after N write cycles.

8. The direct digital frequency synthesizer of claim 1, the read port circuit further comprising a test circuit configured to sample the synthesized frequency clock at a memory operating frequency clock/N rate.

9. The direct digital frequency synthesizer of claim 1, wherein each digital desired pattern has a defined number of periods M.

10. The direct digital frequency synthesizer of claim 1, wherein a frequency of the synthesized frequency clock is determined from the N address spaces, the defined number of periods M, and the sampling frequency clock.

11. The direct digital frequency synthesizer of claim 1, further comprising
    another memory with N' address spaces;
    another write port circuit configured to sequentially write another digital desired pattern into the N' address spaces;
    another read port circuit configured to readout the another digital desired pattern from the N' address spaces using continuous sequential automatic addressing from 0 to N'−1 at the synthesized frequency clock received from the analog signal processing circuit; and
    another analog signal processing circuit configured to
    process a readout another digital desired pattern into another analog representation; and
    output another synthesized frequency clock from the another analog representation to the digital core.

12. A method for direct digital frequency synthesis, the method comprising:
    sequentially writing a digital desired pattern into a memory with N addresses;
    continually sequentially reading the digital desired pattern using a memory operating frequency clock, the memory operating frequency clock based on a sampling frequency clock which is used for high-speed data processing;
    processing a readout digital desired pattern into an analog representation with a desired duty cycle; and
    outputting a synthesized frequency clock from the analog representation to a digital core, where the synthesized frequency clock is fractionally synchronized with the sampling frequency clock.

13. The method of claim 12, further comprising
    dividing down the sampling frequency clock to generate the memory operating frequency clock.

14. The method of claim 12, further comprising
    phase rotating a divided down sampling frequency clock to generate the memory operating frequency clock.

15. The method of claim 12, further comprising
    adjusting a duty cycle of the synthesized frequency clock by controlling a common-mode voltage by switching on/off resistors in a resistor ladder.

16. The method of claim 12, wherein the sequentially writing and continually sequentially reading use a single port.

17. A device comprising:
    a memory with N addresses;
    a port configured to sequentially write a digital desired pattern with M periods into the N addresses;
    the port configured to continually readout in sequence the digital desired pattern from the N addresses at a memory operating frequency clock, wherein the memory operating frequency clock is divided down from a clock used for high-speed data processing; and
    an analog signal processing circuit configured to output an analog synthesized frequency clock with a defined duty cycle from the readout digital desired pattern to a digital core, wherein the analog synthesized frequency clock is fractionally synchronized with the clock and a rate of the analog synthesized frequency clock is determined from the N addresses, the M periods, and the clock.

18. The device of claim 17, further comprising
    a phase rotator configured to rotate a phase of a divided down clock to generate the memory operating frequency clock.

19. The device of claim 17, the analog signal processing circuit further comprising a tunable common-mode correction circuit configured to adjust a duty cycle of the analog synthesized frequency clock.

20. The device of claim 17, the analog signal processing circuit further comprising
    a common-mode correction circuit;
    a resistor ladder connected to a common-mode voltage input of the common-mode correction circuit; and
    a voltage tuner connected to a resistor ladder, the voltage tuner configured to control a configuration of the resistor ladder which adjusts the common-mode voltage input to set a duty cycle of the analog synthesized frequency clock.

21. The device of claim 17, wherein the port is a write port and a read port.

22. The device of claim 17, wherein the port when used for writing the digital desired pattern into the memory is shut down after N write cycles.

23. The device of claim 17, wherein each digital desired pattern has a defined number of periods M and a frequency of the synthesized frequency clock is determined from the N address spaces, the defined number of periods M, and the clock.

* * * * *